(12) United States Patent
Miyagi et al.

(10) Patent No.: US 9,972,516 B2
(45) Date of Patent: May 15, 2018

(54) EXPOSURE DEVICE, SUBSTRATE PROCESSING APPARATUS, EXPOSURE METHOD FOR SUBSTRATE AND SUBSTRATE PROCESSING METHOD

(71) Applicant: SCREEN HOLDINGS CO., LTD., Kyoto (JP)

(72) Inventors: Tadashi Miyagi, Kyoto (JP); Koji Nishi, Kyoto (JP); Toru Momma, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 23 days.

(21) Appl. No.: 15/079,153

(22) Filed: Mar. 24, 2016

(65) Prior Publication Data
US 2016/0282725 A1    Sep. 29, 2016

(30) Foreign Application Priority Data

Mar. 25, 2015  (JP) ................ 2015-062745

(51) Int. Cl.
*H01L 21/67* (2006.01)
*G03F 7/20* (2006.01)
*H01L 21/677* (2006.01)

(52) U.S. Cl.
CPC ........ *H01L 21/67225* (2013.01); *G03F 7/708* (2013.01); *G03F 7/70808* (2013.01);
(Continued)

(58) Field of Classification Search
CPC ......... H01L 21/67225; H01L 21/67253; H01L 21/67748; H01L 21/6776; G03F 7/0035; G03F 7/2002; G03F 7/70808; G03F 7/708
See application file for complete search history.

(56) References Cited

U.S. PATENT DOCUMENTS

2003/0215573 A1  11/2003  Nishibayashi ............... 427/379
2005/0079720 A1   4/2005  Aoyama et al. ............. 438/695
(Continued)

FOREIGN PATENT DOCUMENTS

EP       1 143 491 A1    10/2001
JP      2003-338499 A    11/2003
(Continued)

OTHER PUBLICATIONS

Related U.S. Appl. No. 15/079,147, filed Mar. 24, 2016 by Tadashi Miyagi et al., entitled Exposure Device and Substrate Processing Apparatus.
(Continued)

*Primary Examiner* — Michelle M Iacoletti
(74) *Attorney, Agent, or Firm* — Ostrolenk Faber LLP

(57) ABSTRACT

A local transport hand is configured to be movable in a front-and-rear direction between a rear position rearward of a light emitter and a front position forward of the light emitter. A substrate on which a DSA film is formed is placed on an upper surface of the local transport hand. Vacuum ultraviolet rays having strip-shape cross sections are emitted from the light emitter to cross a moving path of the local transport hand. The local transport hand is moved from the front position to the rear position such that the DSA film on the substrate is irradiated with the vacuum ultraviolet rays emitted by the light emitter. At this time, a moving speed of the substrate is controlled, so that an exposure value for the DSA film formed on the substrate is adjusted.

11 Claims, 24 Drawing Sheets

(52) U.S. Cl.
CPC .... *H01L 21/6776* (2013.01); *H01L 21/67253* (2013.01); *H01L 21/67748* (2013.01)

(56) References Cited

U.S. PATENT DOCUMENTS

| | | | |
|---|---|---|---|
| 2005/0101156 A1 | 5/2005 | Nishibayashi | 438/778 |
| 2005/0186716 A1 | 8/2005 | Kasumi | 438/149 |
| 2007/0178748 A1 | 8/2007 | Kasumi | 439/445 |
| 2013/0258299 A1 | 10/2013 | Nishimura et al. | 355/27 |
| 2013/0342820 A1 | 12/2013 | Kajiyama et al. | 355/67 |
| 2014/0185026 A1 | 7/2014 | Sasaki | 355/67 |
| 2015/0062545 A1 | 3/2015 | Muramatsu et al. | 355/30 |

FOREIGN PATENT DOCUMENTS

| | | |
|---|---|---|
| JP | 2004-319559 | 11/2004 |
| JP | 2012-173512 A | 9/2012 |
| JP | 2013-232611 | 11/2013 |
| JP | 2013-232621 | 11/2013 |
| KR | 10-2001-0089431 A | 10/2001 |
| KR | 10-2002-0055492 A | 7/2002 |
| KR | 10-2005-0053343 A | 6/2005 |
| KR | 10-2013-0102007 A | 9/2013 |
| KR | 10-2014-0085320 A | 7/2014 |
| KR | 10-2015-0026944 A | 3/2015 |
| TW | 201243511 A1 | 11/2012 |
| WO | WO 03/090268 A1 | 10/2003 |

OTHER PUBLICATIONS

M. Muramatsu et al., "Nanopatterning of diblock copolymer directed self-assembly lithography with wet development," Proc. of SPIE, vol. 7970, pp. 79701F1-79701F-7 (2011).

Korean Office Action dated Apr. 14, 2017 in counterpart Korean Patent Application No. 10-2016-0034601.

F I G. 1 0
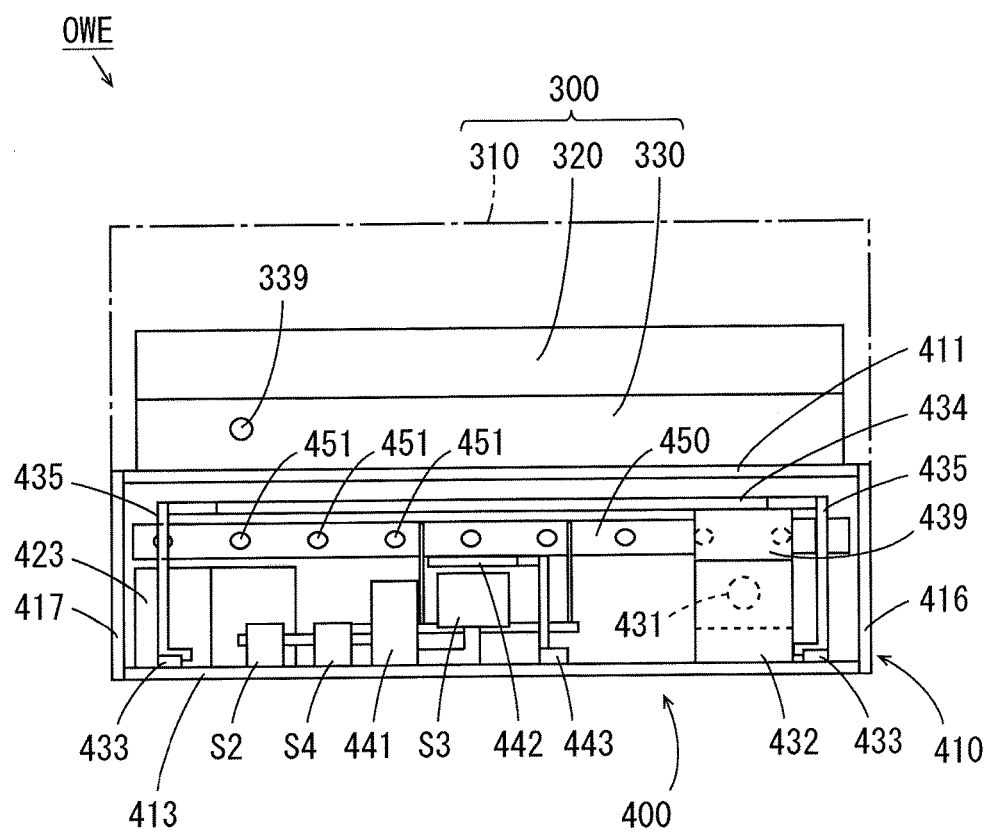

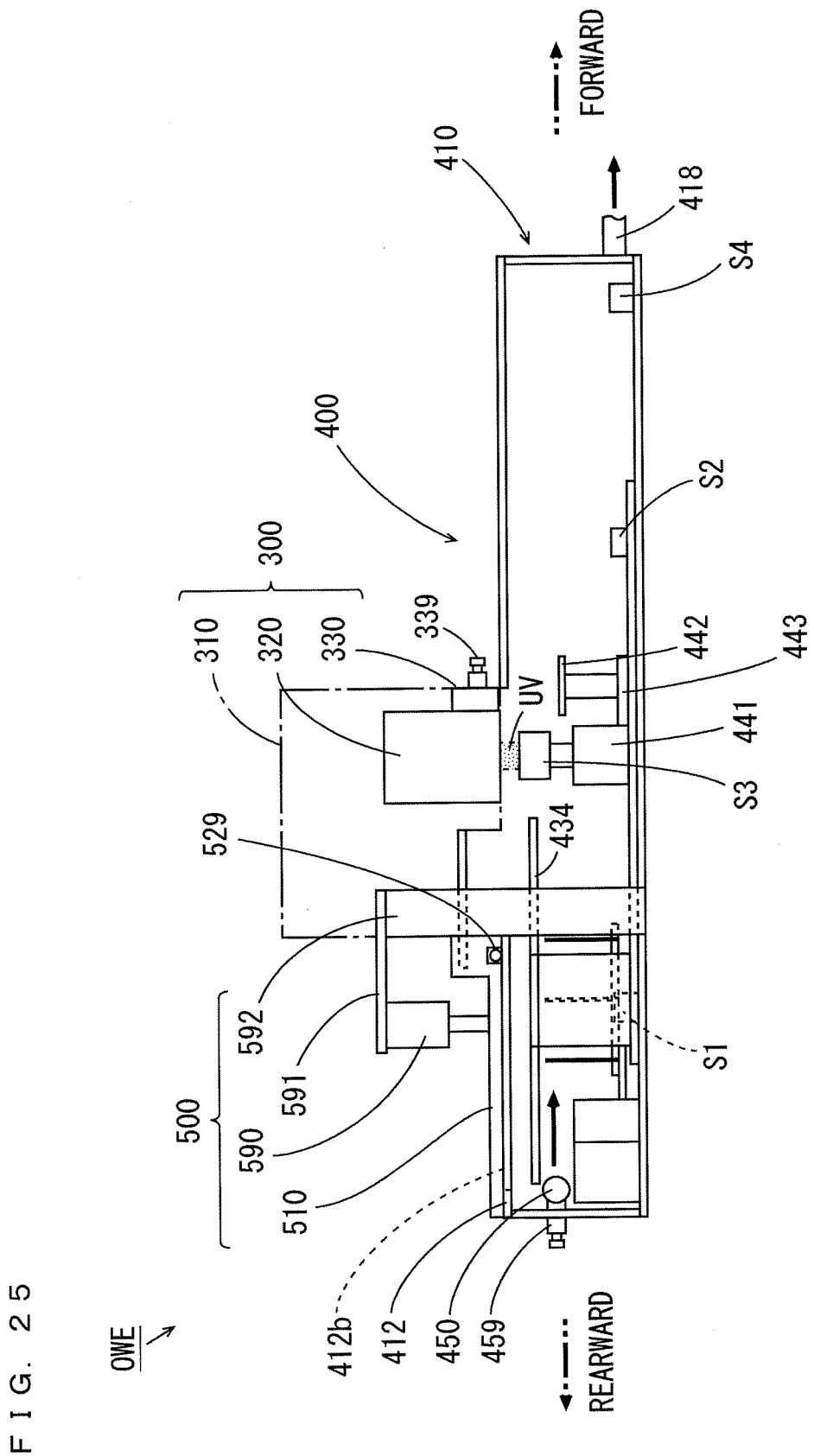

EXPOSURE DEVICE, SUBSTRATE PROCESSING APPARATUS, EXPOSURE METHOD FOR SUBSTRATE AND SUBSTRATE PROCESSING METHOD

BACKGROUND OF THE INVENTION

Field of the Invention

The present invention relates to an exposure device, a substrate processing apparatus that perform exposure processing on a substrate, an exposure method for the substrate and a substrate processing method.

Description of Related Art

Substrate processing apparatuses are used to subject substrates such as semiconductor substrates, substrates for liquid crystal displays, substrates for plasma displays, substrates for optical discs, substrates for magnetic discs, substrates for magneto-optical discs, substrates for photomasks and other substrates to various types of processing.

As such a substrate processing apparatus, a film formation apparatus that forms a dielectric film on one surface of a substrate is described in JP 2004-319559 A. The film formation apparatus has an ultraviolet ray irradiation unit. The ultraviolet ray irradiation unit irradiates the one surface of the substrate with ultraviolet flux before the dielectric film is formed. Specifically, the substrate is placed on a platform stage provided to be movable in one direction. Thereafter, the platform stage is moved to cross a strip-shape irradiation region of the ultraviolet flux emitted from an ultraviolet ray lamp. Thus, the one surface of the substrate is exposed to the ultraviolet rays, and the one surface of the substrate is reformed.

BRIEF SUMMARY OF THE INVENTION

In recent years, a photolithographic technique utilizing DSA (Directed Self Assembly) of a block copolymer for making finer patterns has been developed. In the photolithographic technique, processing for reforming a resist film formed on one surface of the substrate by exposing in order to form a guide pattern of a block polymer, for example, has been suggested (see JP 2013-232611 A, for example). Further, processing for reforming one of two types of polymers by exposing one surface of the substrate after heating processing for the substrate to which the block copolymer is applied is performed is suggested (see JP 2013-232621 A, for example). In these processing, an exposure value for the substrate is required to be accurately adjusted.

In an ultraviolet ray irradiation unit described in the above-mentioned JP 2004-319559 A, an optical sensor is provided on a platform stage. When the platform stage is moved, an exposure value for the substrate is detected by the optical sensor. Any of electric power supplied to the ultraviolet ray lamp, a width of an irradiation region of the ultraviolet flux by the ultraviolet ray lamp, and an oxygen concentration in a space directly upward of the irradiation region of the ultraviolet flux with which the substrate is irradiated is controlled based on the detected exposure value such that the exposure value for the substrate is a predetermined value.

Output of light emitted from the ultraviolet ray lamp is reduced due to deterioration over time, contamination of an emission surface or the like. Thus, the exposure value for the substrate is reduced. In this case, it is possible to increase the exposure value for the substrate by increasing the electric power supplied to the ultraviolet ray lamp, increasing the width of the irradiation region of the ultraviolet flux, or reducing the oxygen concentration in a space directly upward of the irradiation region.

However, there is a limit to the exposure value that can be increased by an increase in electric power, an increase in width of the irradiation region of the ultraviolet flux, and a reduction in oxygen concentration in a space directly upward of the irradiation region. Therefore, when the output of light emitted from the ultraviolet ray lamp is markedly reduced, the predetermined exposure value is not acquired.

An object of the present invention is to provide an exposure device, a substrate processing apparatus, an exposure method, and a substrate processing method capable of exposing a film formed on one surface of a substrate with a predetermined exposure value.

(1) According to one aspect of the present invention, an exposure device that exposes a substrate includes a holder that holds the substrate having one surface on which a film having a predetermined pattern is formed, an emitter that emits light for reforming the film, a relative mover that moves at least one of the holder and the emitter in one direction relative to another one such that the one surface of the substrate held by the holder is irradiated with light emitted by the emitter, and a controller that controls relative moving speed of the holder and the emitter by the relative mover such that an exposure value for the film is a predetermined exposure value.

In the exposure device, the one surface of the substrate is irradiated with light emitted by the emitter while at least one of the holder holding the substrate and the emitter is moved in one direction relative to the other one. Thus, the entire film is exposed. In this case, the relative moving speed of the holder and the emitter are controlled, so that the exposure amount for the film is adjusted. The exposure value can be reduced by an increase in moving speed. Further, the exposure value can be increased by a reduction in moving speed. Thus, it is possible to adjust the exposure value over a wide range regardless of the output of light emitted from the emitter. As a result, even when the output of light is changed, it is possible to expose the film formed on the one surface of the substrate with a predetermined exposure value.

(2) The exposure device may further include an illumination intensity detector that detects illumination intensity of light with which the substrate is irradiated by the emitter, wherein the controller may calculate a moving speed for acquiring the predetermined exposure value based on the illumination intensity detected by the illumination intensity detector, and may control the relative mover such that the holder and the emitter are relatively moved at the calculated moving speed.

In this case, feedback control of the moving speed is performed such that the exposure value for the film is equal to the predetermined exposure value based on the illumination intensity detected by the illumination intensity detector. Thus, the film formed on the one surface of the substrate can be accurately exposed with the predetermined exposure value.

(3) The relative mover may move the holder in one direction relative to the emitter during irradiation of the substrate with light by the emitter, the illumination intensity detector may include a light receiving element that receives light emitted by the emitter, and a light receiving element moving mechanism that moves the light receiving element, and the light receiving element moving mechanism moves the light receiving element to a position that does not interfere with the substrate during the irradiation of the substrate with light by the emitter, and moves the light receiving element onto a moving path of the substrate by the relative mover during detection of illumination intensity except for a period in which the substrate is being irradiated with light.

In this case, the illumination intensity is detected on the moving path of the exposed substrate without interference of the light receiving element with the substrate. Thus, the illumination intensity of light with which the film is irradiated can be accurately detected.

(4) The illumination intensity detector may further include a light blocking mechanism configured to be switchable between a first state in which light emitted by the emitter is incident on the light receiving element and a second state in which light emitted by the emitter is not incident on the light receiving element, and the controller may switch the light blocking mechanism to the first state during detection of the illumination intensity, and may switch the light blocking mechanism to the second state during the irradiation of the substrate with light by the emitter.

In this case, light is not incident on the light receiving element during irradiation of the substrate with light. Therefore, deterioration of the light receiving element is inhibited, and prolongation of the useful life of the light receiving element is realized.

(5) The exposure device may further include a casing that stores a substrate held by the holder, an inert gas supplier that supplies an inert gas to an inside of the casing, and a concentration detector that detects an oxygen concentration in the casing, wherein the controller may control the emitter and the relative mover such that, when the oxygen concentration detected by the concentration detector is not more than a predetermined processing concentration, the substrate is irradiated with light emitted by the emitter.

In this case, the substrate is irradiated with light by the emitter in an atmosphere having an oxygen concentration that is not more than the predetermined processing concentration. Thus, large attenuation of the light emitted by the emitter caused by oxygen is inhibited. Therefore, a reduction in processing efficiency of exposure is inhibited.

(6) Light from the emitter with which the substrate may be irradiated includes vacuum ultraviolet rays.

In this case, even when the substrate is irradiated with the vacuum ultraviolet rays that are likely to attenuate due to oxygen, a reduction in processing efficiency of exposure is inhibited.

(7) According to another aspect of the present invention, a substrate processing apparatus includes the above-mentioned exposure device, a coating processor that forms the film on the one surface of the substrate by applying a processing liquid including a directed self assembly material to the one surface of the substrate before irradiation with light by the exposure device, a thermal processor that performs thermal processing on the substrate after formation of the film by the coating processor and before irradiation with light by the exposure device, and a development processor that performs development processing for the film by supplying a solvent to the one surface of the substrate after irradiation with light by the exposure device.

In the substrate processing apparatus, the thermal processing is performed on the substrate to which the processing liquid is applied before irradiation with light by the above-mentioned exposure device, so that a microphase separation occurs on the one surface of the substrate. The one surface of the substrate on which patterns of two types of polymers are formed by the microphase separation is irradiated with light by the above-mentioned exposure device. In the above-mentioned exposure device, the film formed on the one surface of the substrate can be exposed with the predetermined exposure value. Therefore, the film formed on the one surface of the substrate can be reformed with high accuracy. Thereafter, the development processing is performed. In the development processing, one of the two types of polymers is removed by a solvent. In this manner, the above-mentioned substrate processing apparatus causes the application of the processing liquid, the thermal processing, the exposure processing and the development processing for the substrate to be continuously performed.

(8) According to yet another aspect of the present invention, an exposure method for exposing a substrate includes the steps of holding the substrate having one surface on which a film having a predetermined pattern is formed by a holder, emitting light for reforming the film by an emitter, moving at least one of the holder and the emitter in one direction relative to another one such that the one surface of the substrate held by the holder is irradiated with light emitted by the emitter, and controlling relative moving speed of the holder and the emitter such that an exposure value for the film is a predetermined exposure value.

In the exposure method, the one surface of the substrate is irradiated with light emitted by the emitter while at least one of the holder holding the substrate and the emitter is moved in one direction relative to the other one. Thus, the entire film is exposed. In this case, the relative moving speed of the holder and the emitter are controlled, so that the exposure value for the film is adjusted. The exposure value can be reduced by an increase in moving speed. Further, the exposure value can be increased by a reduction in moving speed. Thus, it is possible to adjust the exposure value over a wide range regardless of the output of light emitted from the emitter. As a result, even when the output of light is changed, the film formed on the one surface of the substrate can be exposed with the predetermined exposure value.

(9) The exposure method may further include the step of detecting illumination intensity of light with which the substrate is irradiated by the emitter, wherein the step of controlling the moving speed may include calculating a moving speed for acquiring the predetermined exposure value based on the detected illumination intensity, and controlling the relative moving speed of the holder and the emitter such that the holder and the emitter are relatively moved at the calculated moving speed.

In this case, the feedback control of the moving speed is performed such that the exposure value for the film is equal to the predetermined exposure value based on the detected illumination intensity. Thus, the film formed on the one surface of the substrate can be accurately exposed with the predetermined exposure value.

(10) The step of relatively moving may be moving the holder in one direction relative to the emitter, and the step of detecting the illumination intensity may include moving a light receiving element that receives light emitted by the emitter to a position that does not interfere with the substrate during irradiation of the substrate with light by the emitter, and moving the light receiving element onto a moving path of the substrate moved by the holder during detection of illumination intensity except for a period in which the substrate is being irradiated with light.

In this case, the illumination intensity is detected on the moving path of the exposed substrate without interference of the light receiving element with the substrate. Thus, the illumination intensity of light with which the film is irradiated can be accurately detected.

(11) The exposure method may further include the step of controlling a light blocking mechanism configured to be switchable between a first state in which light emitted from the emitter is incident on the light receiving element and a second state in which light emitted by the emitter is not incident on the light receiving element, wherein the step of controlling the light blocking mechanism may include switching the light blocking mechanism to the first state during detection of the illumination intensity and switching the light blocking mechanism to the second state during irradiation of the substrate with light by the emitter.

In this case, light is not incident on the light receiving element during irradiation of the substrate with light. Therefore, deterioration of the light receiving element is inhibited, and prolongation of the useful life of the light receiving element is realized.

(12) The exposure method may further include the steps of storing the substrate held by the holder in a casing, detecting an oxygen concentration in the casing, and performing irradiation of the substrate with light by the emitter when the detected oxygen concentration is not more than a predetermined processing concentration.

In this case, the substrate is irradiated with light by the emitter in an atmosphere having an oxygen concentration that is not more than the predetermined processing concentration. Thus, large attenuation of light emitted by the emitter caused by oxygen is inhibited. Therefore, a reduction in processing efficiency of the exposure is inhibited.

(13) According to yet another aspect of the present invention, a substrate processing method includes the above-mentioned exposure method, the step of forming the film on the one surface of the substrate by applying a processing liquid including a directed self assembly material to the one surface of the substrate before irradiation with light by the exposure method, the step of performing thermal processing on the substrate after formation of the film and before the irradiation with light by the exposure method, and the step of performing development processing for the film by supplying a solvent to the one surface of the substrate after the irradiation with light by the exposure method.

In the substrate processing method, the thermal processing is performed on the substrate to which the processing liquid is applied before irradiation with light by the above-mentioned exposure method, so that the microphase separation occurs on the one surface of the substrate. The one surface of the substrate on which patterns of two types of polymers are formed by the microphase separation is irradiated with light by the above-mentioned exposure method. In the above-mentioned exposure method, the film formed on the one surface of the substrate can be exposed with the predetermined exposure value. Therefore, the film formed on the one surface of the substrate can be reformed with high accuracy. Thereafter, the development processing is performed. In the development processing, one of the two types of polymers is removed by a solvent. In this manner, in the above-mentioned substrate processing method, the application of the processing liquid, the thermal processing, the exposure processing and the development processing for the substrate is continuously performed.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 10 is a front view for explaining the inner structure of the exposure device;

FIG. 25 is a side view for explaining the illumination intensity measurement operation in the exposure device.

DESCRIPTION OF THE PREFERRED EMBODIMENTS

An exposure device, a substrate processing apparatus, an exposure method and a substrate processing method according to one embodiment of the present invention will be described below with reference to drawings. In the substrate processing apparatus described below, processing utilizing DSA (Directed Self Assembly) of a block copolymer is performed. Specifically, a processing liquid including a DSA material is applied to an upper surface of a substrate. Thereafter, patterns of two types of polymers are formed on the substrate by a microphase separation that occurs in the DSA material. One pattern of the two types of polymers is removed by a solvent. Details of a series of these processing will be described below.

In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, a processing liquid including the DSA material is referred to as a DSA liquid. Further, processing for removing one of the patterns of the two types of polymers formed on the substrate by the microphase separation is referred to as development processing, and the solvent used for the development processing is referred to as a development liquid.

[1] Overall Configuration of Substrate Processing Apparatus

Figure 1:
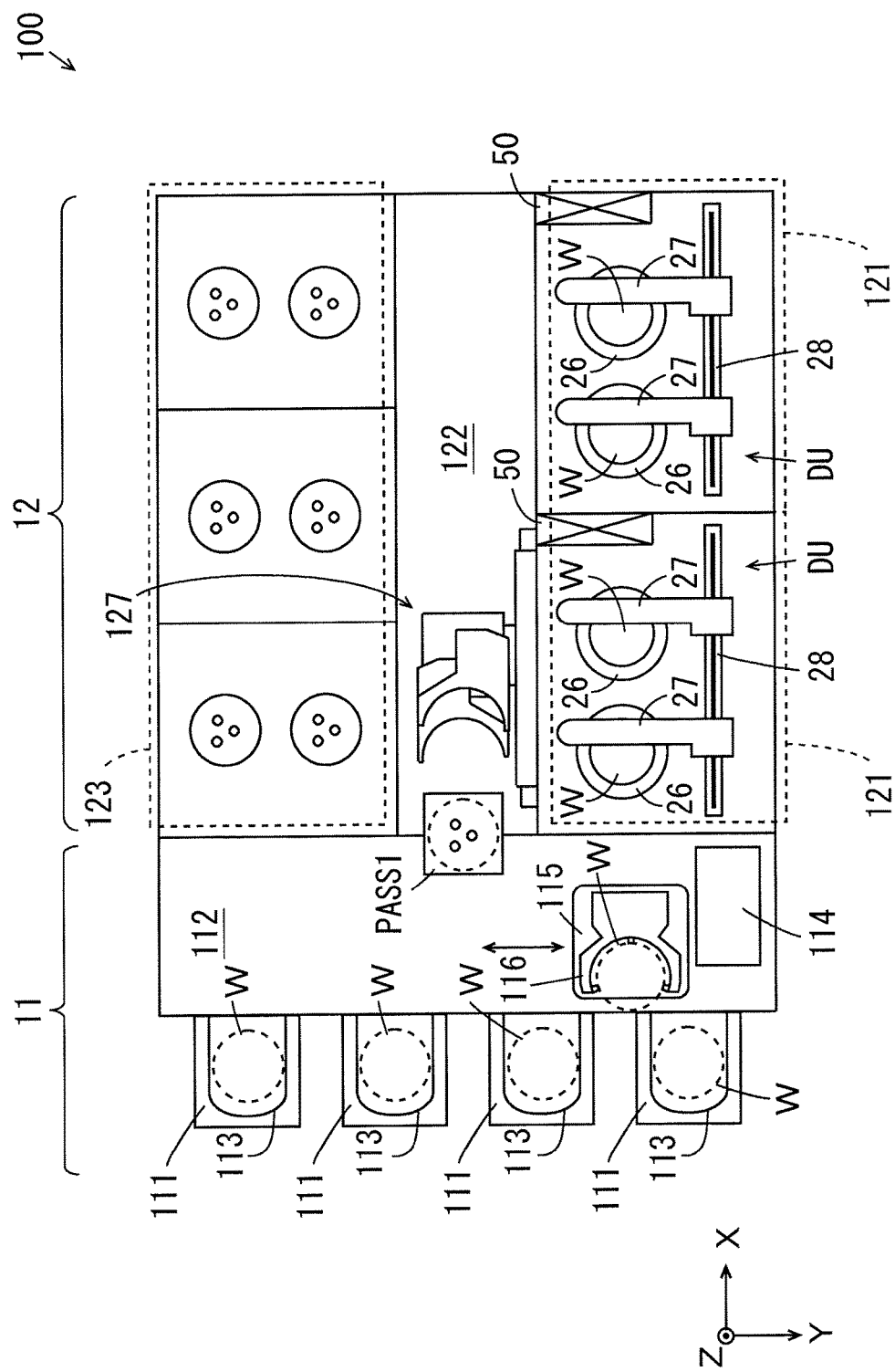
FIG. 1 is a schematic plan view of a substrate processing apparatus according to one embodiment of the present invention.

FIG. 1 is a schematic plan view of the substrate processing apparatus according to one embodiment of the present invention. FIG. 1 and subsequent given drawings are accompanied by arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11 and a processing block 12. The indexer block 11 includes a plurality (four in the present example) of carrier platforms 111 and a transport section 112. In each carrier platform 111, a carrier 113 for storing a plurality of substrates W in multiple stages is placed.

Figure 4:
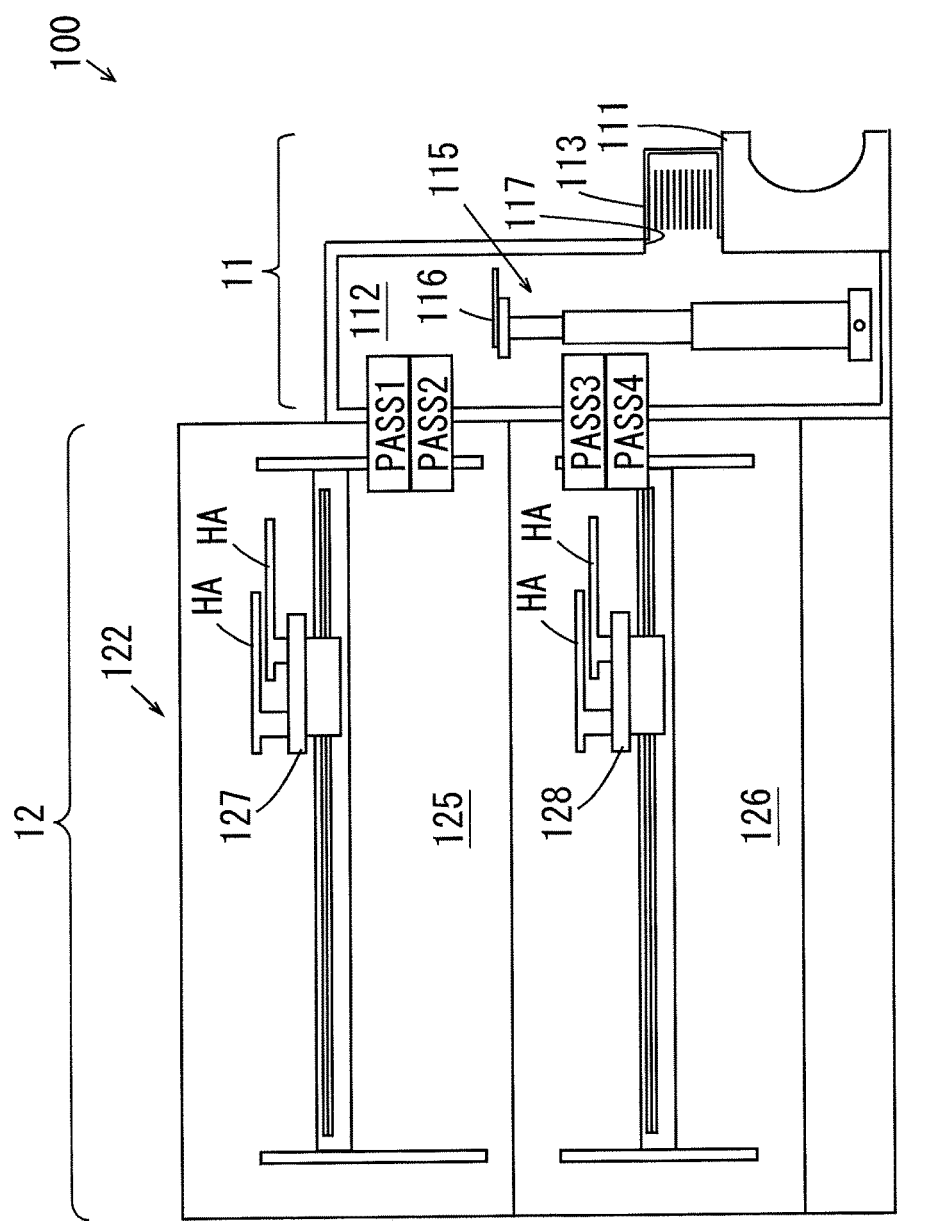
FIG. 4 is a schematic side view mainly showing a transport section of FIG. 1.

A controller 114 and a transport mechanism 115 are provided in the transport section 112. The controller 114 includes a CPU (Central Processing Unit) and a memory, or a microcomputer, for example, and controls various constituent elements of the substrate processing apparatus 100. The transport mechanism 115 has a hand 116 for holding the substrate W. The transport mechanism 115 holds the substrate W using the hand 116 and transports the substrate W. As shown in FIG. 4, described below, an opening 117 for receiving and transferring the substrate W between the carrier 113 and the transport mechanism 115 is formed at the transport section 112.

The processing block 12 includes two coating development processing sections 121, a transport section 122 and a thermal processing section 123. The two coating development processing sections 121 are arranged in the X direction. The two coating development processing sections 121 and the thermal processing section 123 are provided to be opposite to each other with the transport section 122 sandwiched therebetween. A substrate platform PASS1 and substrate platforms PASS2 to PASS4 (FIG. 4), described below, on which the substrates W are placed are provided between the transport section 122 and the indexer block 11. In the transport section 122, a transport mechanism 127 and a transport mechanism 128 that is described below (FIG. 4), which transport the substrates W are provided.

Figure 2:
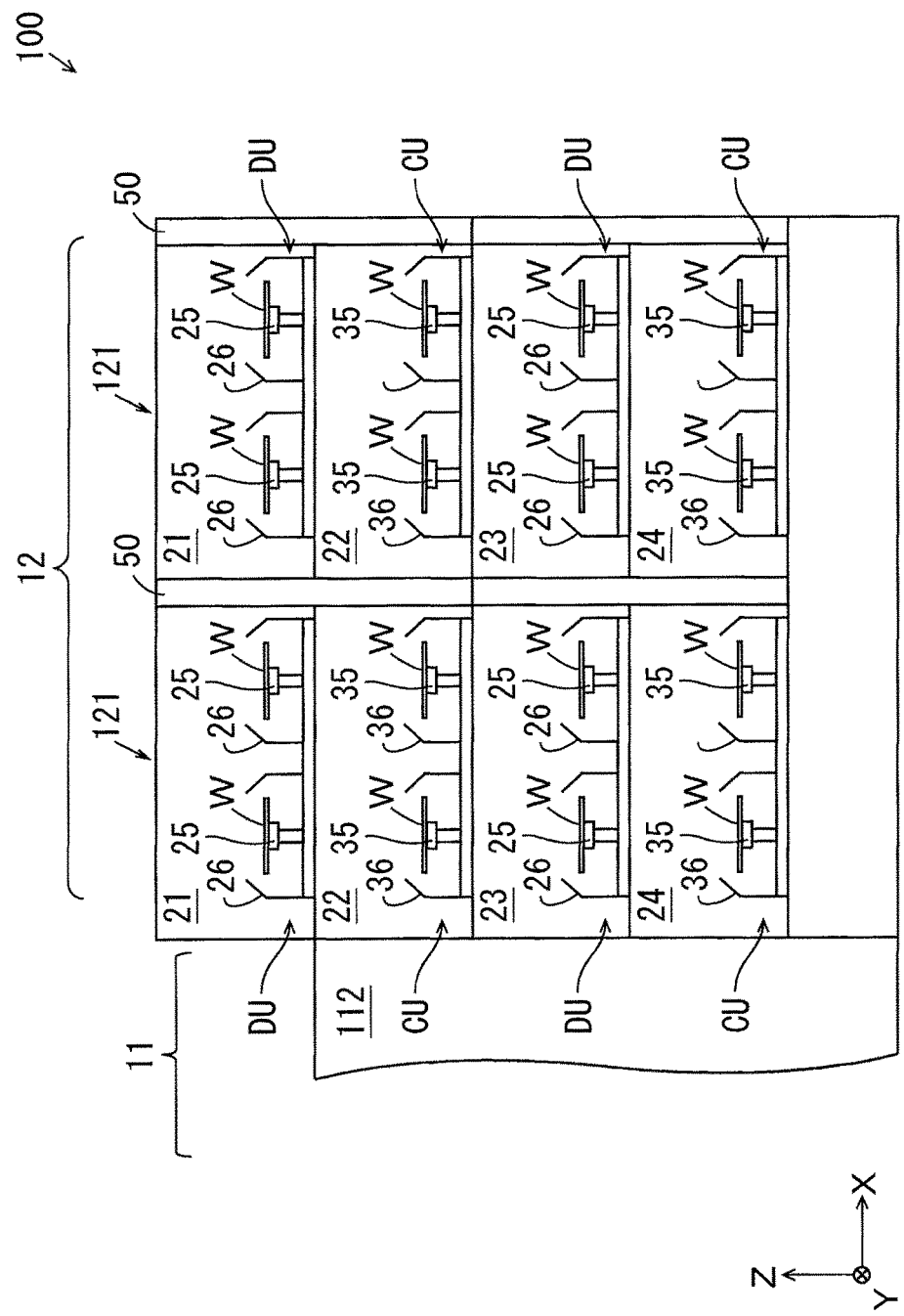
FIG. 2 is a schematic side view of the substrate processing apparatus mainly showing two coating development processing sections of FIG. 1.

FIG. 2 is a schematic side view of the substrate processing apparatus 100 mainly showing the two coating development processing sections 121 of FIG. 1. As shown in FIG. 2, development processing chambers 21, 23 and coating processing chambers 22, 24 are provided in a stack in each coating development processing section 121. A development processing unit DU is provided in each of the development processing chambers 21, 23, and a coating processing unit CU is provided in each of the coating processing chambers 22, 24.

Each development processing unit DU includes one or plurality of spin chucks 25 that hold the substrates W and cups 26 provided to respectively cover the surroundings of the spin chucks 25. In the present embodiment, two pairs of the spin chucks 25 and the cups 26 are provided in one development processing unit DU. Further, as shown in FIG. 1, each development processing unit DU includes two development nozzles 27 that discharge the development liquid and a moving mechanism 28 that moves the development nozzles 27 in the X direction.

In the development processing unit DU, the two spin chucks 25 are respectively rotated by a driving device (not shown), and the one development nozzle 27 supplies the development liquid to the substrate W held by one spin chuck 25. Further, the other development nozzle 27 supplies the development liquid to the substrate W held by the other spin chuck 25. In this manner, the development liquid is supplied to the substrate W, so that the development processing for the substrate W is performed.

Similarly to the development processing unit DU, each coating processing unit CU includes one or plurality of spin chucks 35 and one or plurality of cups 36. In the present embodiment, two pairs of the spin chucks 35 and the cups 36 are provided in one coating processing unit CU. The rotation of each spin chuck 35 is driven by a driving device (not shown)(an electric motor, for example). Further, the coating processing unit CU includes a plurality of processing liquid nozzles (not shown) that discharge the DSA liquid, and a nozzle transport mechanism (not shown) that transports these processing liquid nozzles.

In the coating processing unit CU, the spin chuck 35 is rotated by the driving device (not shown), any processing liquid nozzle of the plurality of processing liquid nozzles is moved to a position directly upward of the substrate W by the nozzle transport mechanism, and the DSA liquid is discharged from the processing liquid nozzle. Thus, the DSA liquid is applied to the upper surface of the substrate W. Further, a rinse liquid is discharged to a peripheral portion of the substrate W from an edge rinse nozzle (not shown). Thus, the DSA liquid adhering to the peripheral portion of the substrate W is removed.

In the present embodiment, a block copolymer constituted by two types of polymers is used as the DSA liquid. Combinations of two types of polymers include Polystyrene-Polymethylmethacrylate (PS-PMMA), Polystyrene-Polydimethylsiloxane (PS-PDMS), Polyethylene-Polyferrocenyldimethylsilane (PS-PFS), Polystyrene-Polyethylene oxide (PS-PEO), Polystyrene-Polyvinyl Pyridine (PS-PVP), Polyethylene-Polyhydroxystyrene (PS-PHOST), and Polymethylmethacrylate-Polymethacrylate-Polyhedral-Oligomeric-Silsesqauioxan (PMMA-PMAPOSS), for example.

Further, a solvent of the development liquid includes Toluene, Heptane, Acetone, Propylene Glycol Monomethyl Ether Acetate (PGMEA), Propylene glycol monomethylether (PGME), Cyclohexanone, Acetic Acid, Tetrahydrofuran, Isopropyl Alcohol (IPA), or Tetramethylammonium Hydroxide (TMAH), for example.

As shown in FIGS. 1 and 2, a fluid box 50 is provided at one end of each coating development processing section 121. The fluid box 50 houses fluid related elements such as pipes, joints, valves, flowmeters, regulators, pumps and temperature adjusters used to supply the development liquid and the DSA liquid to the development processing unit DU and the coating processing unit CU and discharge the liquid and air out of development processing unit DU and the coating processing unit CU.

Figure 3:
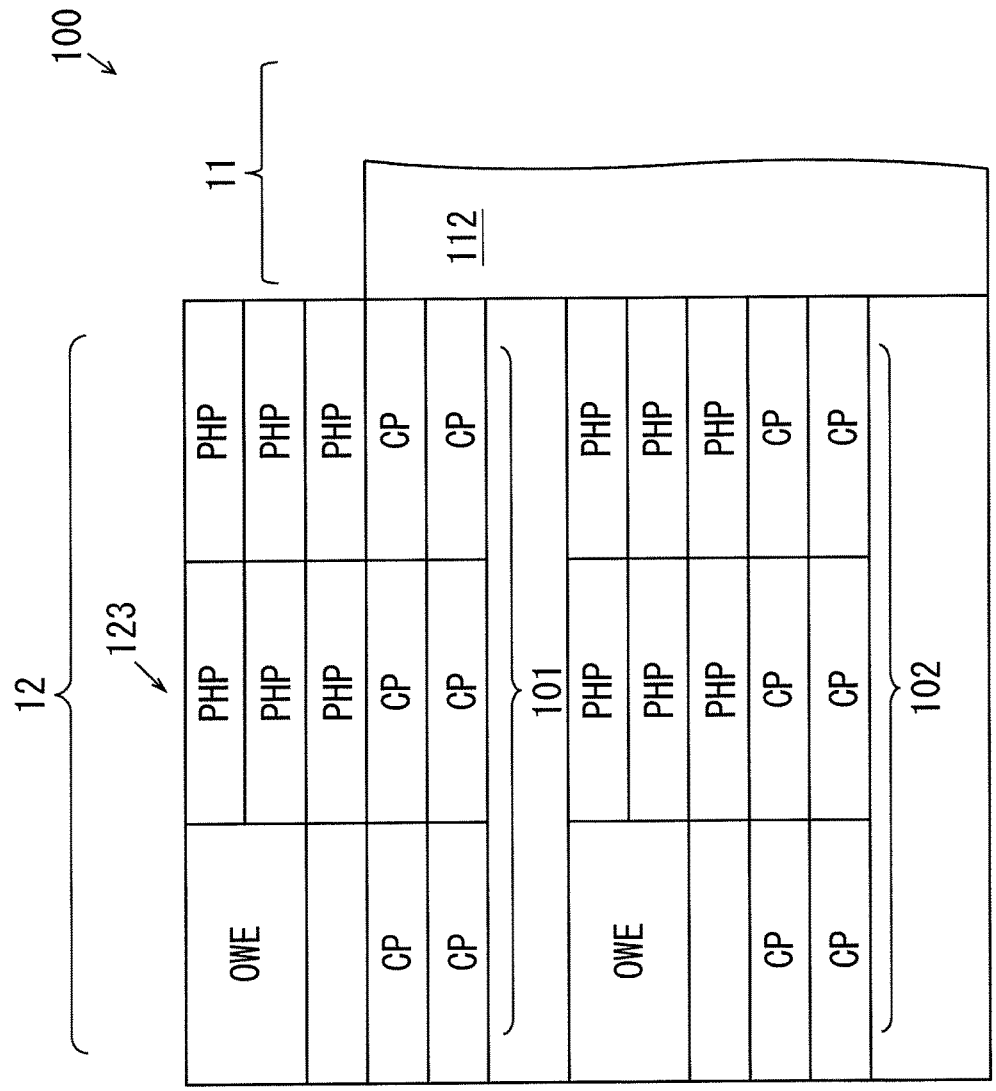
FIG. 3 is a schematic side view of the substrate processing apparatus mainly showing a thermal processing section of FIG. 1.

FIG. 3 is a schematic side view of the substrate processing apparatus 100 mainly showing the thermal processing section 123 of FIG. 1. As shown in FIG. 3, the thermal processing section 123 has an upper thermal processing section 101 provided above, and a lower thermal processing section 102 provided below. In each of the upper thermal processing section 101 and the lower thermal processing section 102, a plurality of thermal processing units PHP, a plurality of cooling units CP and an exposure device OWE are provided.

In each thermal processing unit PHP, heating processing for the substrate W is performed. In each cooling unit CP, cooling processing for the substrate W is performed. In each exposure device OWE, the exposure processing for the substrate W is performed. Details of the exposure device OWE will be described below.

FIG. 4 is a schematic side view mainly showing the transport sections 112, 122 of FIG. 1. As shown in FIG. 4, the transport section 122 has an upper transport chamber 125 and a lower transport chamber 126. A transport mechanism 127 is provided in the upper transport chamber 125, and a transport mechanism 128 is provided in the lower transport chamber 126.

The substrate platforms PASS1, PASS2 are provided between the transport section 112 and the upper transport chamber 125, and the substrate platforms PASS3, PASS4 are provided between the transport section 112 and the lower transport chamber 126.

The substrate W transported from the indexer block 11 to the processing block 12 is placed on each of the substrate platforms PASS1, PASS3. The substrate W transported from the processing block 12 to the indexer block 11 is placed on each of the substrate platforms PASS2, PASS4.

Each of the transport mechanisms 127, 128 can hold the substrate W using two hands HA and transport the substrate W by moving in the X direction and the Z direction. The transport mechanism 127 transports the substrate W among the substrate platforms PASS1, PASS2, the development processing chamber 21 (FIG. 2), the coating processing chamber 22 (FIG. 2) and the upper thermal processing section 101 (FIG. 3). The transport mechanism 128 transports the substrate W among the substrate platforms PASS3, PASS4, the development processing chamber 23 (FIG. 2), the coating processing chamber 24 (FIG. 2) and the lower thermal processing section 102 (FIG. 3).

[2] Processing for Substrate

Figure 5A:
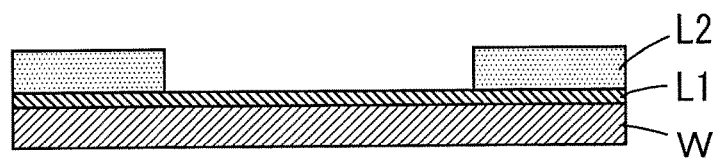
FIGS. 5A to 5D are schematic diagrams showing one example of processing for a substrate by the substrate processing apparatus of FIG. 1.

FIGS. 5A to 5D are schematic diagrams showing one example of the processing for the substrate W by the substrate processing apparatus 100 of FIG. 1. In FIGS. 5A to 5D, states of the substrate W that change every time processing is performed are shown in cross sectional views. In the present example, as an initial state before the substrate W is carried into the substrate processing apparatus 100, an underlayer L1 is formed to cover an upper surface (a main surface) of the substrate W, and guide patterns L2 made of a photo resist, for example, are formed on the underlayer L1, as shown in FIG. 5A.

Figure 5B:
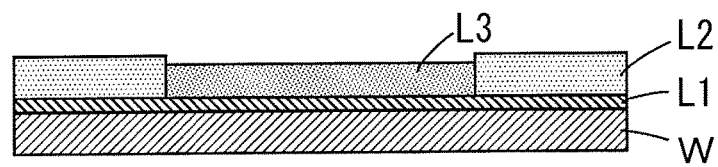

In the substrate processing apparatus 100, the DSA liquid is applied to the upper surface of the substrate W by the coating processing unit CU of FIG. 2. Thus, as shown in FIG. 5B, a film of the DSA liquid constituted by two types of polymers (hereinafter referred to as a DSA film) L3 is formed in a region, on the underlayer L1, in which the guide pattern L2 is not formed.

Figure 5C:
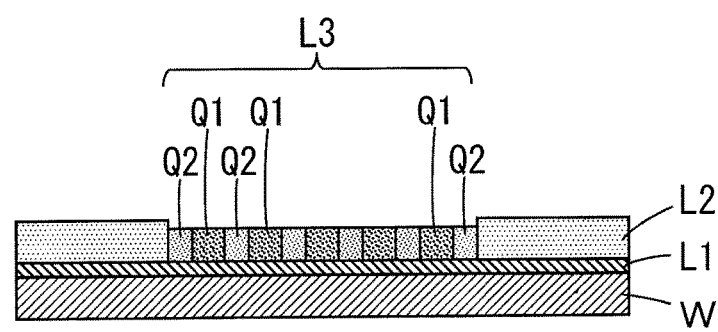

Next, the heating processing is performed on the DSA film L3 on the substrate W by the thermal processing unit PHP of FIG. 3, so that the microphase separation occurs in the DSA film L3. As a result, as shown in FIG. 5C, patterns Q1 made of one polymer and patterns Q2 made of the other polymer are formed. In the present example, the line patterns Q1 and the line patterns Q2 are directionally formed to extend along the guide patterns L2.

Next, the entire DSA film L3 after the microphase separation is irradiated with light for reforming the DSA film L3 by the exposure device OWE of FIG. 3, and the exposure processing is performed. In the present embodiment, ultraviolet rays (vacuum ultraviolet rays) having a wavelength of not less than about 120 nm and not more than about 230 nm is used as light for reforming the DSA film L3. Thus, coupling between the one polymer and the other polymer is cut off, and each pattern Q1 and each pattern Q2 are separated from each other.

Figure 5D:
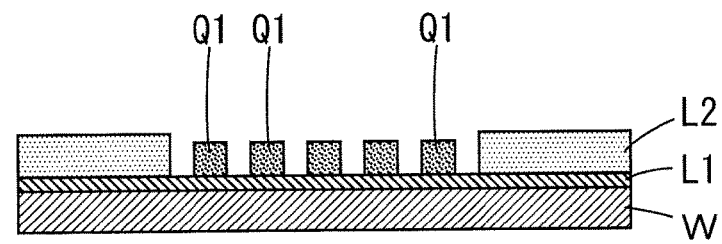

Next, the development liquid is supplied to the DSA film L3 on the substrate W by the development processing unit DU of FIG. 2, and the development processing is performed. Thus, as shown in FIG. 5D, the patterns Q2 are removed. Finally, the patterns Q1 remain on the substrate W.

[3] Exposure Device

Figure 6:
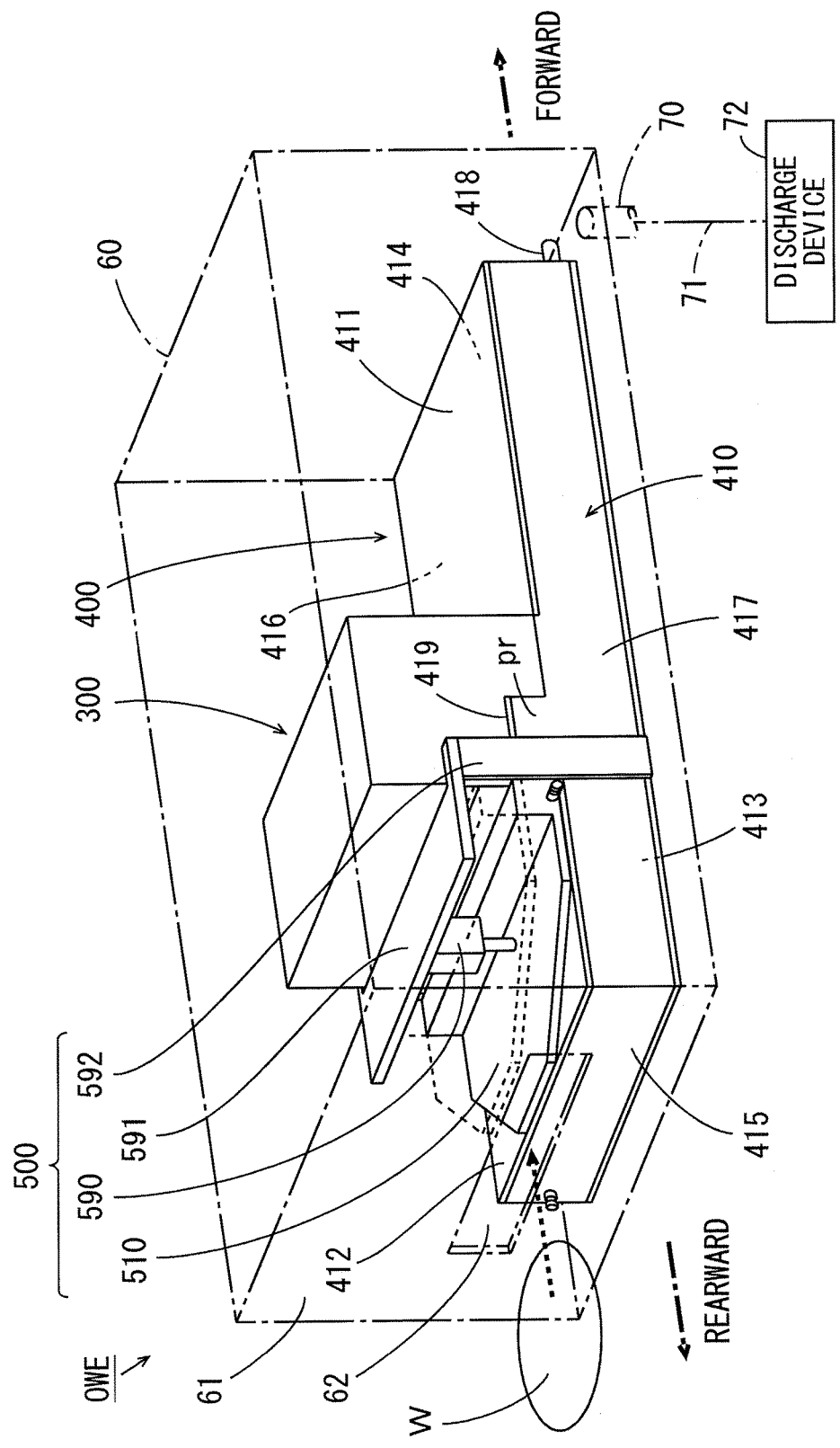
FIG. 6 is an external perspective view of an exposure device.
Figure 7:
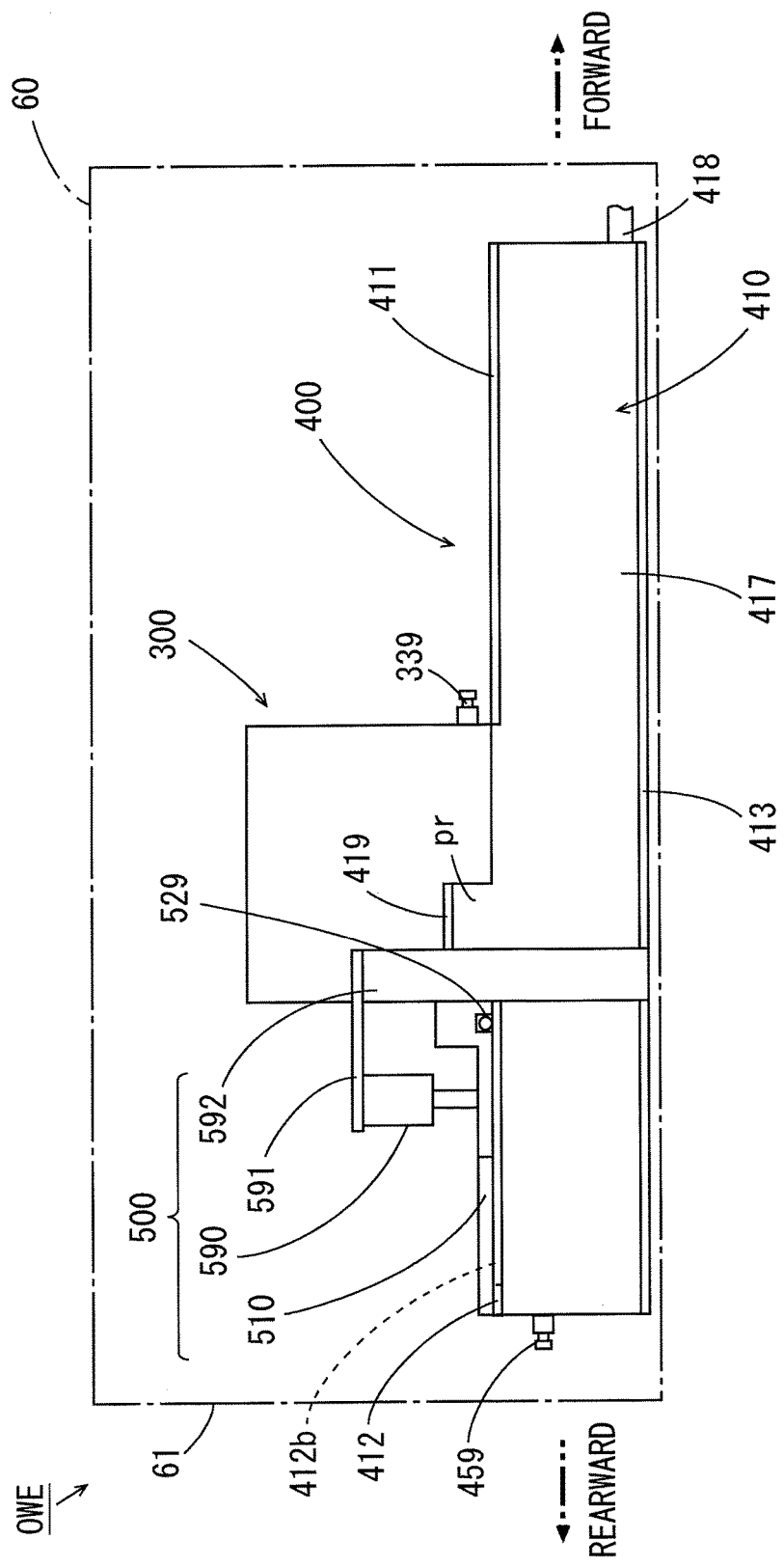
FIG. 7 is a side view of the exposure device.

FIG. 6 is an external perspective view of the exposure device OWE, and FIG. 7 is a side view of the exposure device OWE. As indicated by one-dot and dash lines in each of FIGS. 6 and 7, the exposure device OWE includes a casing 60. The casing 60 has an outer wall 61 facing the transport section 122 of FIG. 1. As shown in FIG. 6, a transport opening 62 for transporting the substrate W between the transport section 122 and the casing 60 is formed at the outer wall 61. Further, a discharger 70 is provided at the bottom of the casing 60. The discharger 70 is connected to a discharge device 72 via a pipe 71. The discharge device 72 is discharge equipment in a factory, for example, and performs detoxification processing for the gas discharged from the casing 60 and the like. Thus, even when ozone is generated in the exposure device OWE during the exposure processing for the substrate W, described below, the generated ozone is sent to the discharge device 72 through the discharger 70 and the pipe 71. Therefore, ozone generated by the exposure processing is prevented from spreading to surroundings of the exposure device OWE.

In the following description, as indicated by thick one-dot and dash arrows in each of FIG. 6 and subsequent given diagrams, a direction directed from the inside of the casing 60 towards the transport opening 62 is referred to as rearward, and its opposite direction is referred to as forward.

The exposure device OWE is mainly constituted by a light emitter 300, a substrate mover 400 and a carry-in carry-out mechanism 500 in addition to the casing 60. The substrate mover 400 includes a casing 410 having a substantially rectangular parallelepiped shape. The casing 410 includes a front upper surface portion 411, a central upper surface portion 419, a rear upper surface portion 412, a lower surface portion 413, a front surface portion 414, a rear surface portion 415, one side surface portion 416 and the other side surface portion 417.

The one side surface portion 416 and the other side surface portion 417 are provided to extend in a front-and-rear direction and be opposite to each other. A projection pr projecting upward by a constant height is formed at the center of the upper end of each of the one side surface portion 416 and the other side surface portion 417. In each of FIGS. 6 and 7, only the projection pr of the other side surface portion 417 of the projections pr of the one side surface portion 416 and the other side surface portion 417 is shown.

The central upper surface portion 419 is provided to connect the projection pr of the one side surface portion 416 to the projection pr of the other side surface portion 417. The front upper surface portion 411 is provided to connect the upper end of the one side surface portion 416 to the upper end of the other side surface portion 417 at a position forward of the projection pr. The rear upper surface portion 412 is provided to connect the upper end of the one side surface portion 416 to the upper end of the other side surface portion 417 at a position rearward of the projections pr. The height of the front upper surface portion 411 and the height of the rear upper surface portion 412 are equal to each other.

The light emitter 300 is provided on the casing 410 to connect the upper end of the one side surface portion 416 to the upper end of the other side surface portion 417 and be located between the front upper surface portion 411 and the rear upper surface portion 412. Part of the light emitter 300 is located directly upward of the central upper surface portion 419. Details of the light emitter 300 will be described below.

The carry-in carry-out mechanism 500 is provided behind the light emitter 300. As shown in FIG. 7, the carry-in carry-out mechanism 500 includes a cover member 510, a cover driver 590, a support plate 591 and two support shafts 592. In FIG. 7, only one support shaft 592 of the two support shafts 592 is shown. The two support shafts 592 are respectively provided to extend in an up-and-down direction on both sides of the casing 410. The support plate 591 is supported in a horizontal attitude by the two support shafts 592. In this state, the support plate 591 is located behind the light emitter 300 and directly upward of the rear upper surface portion 412. The cover driver 590 is attached to the lower surface of the support plate 591. The cover member 510 is provided directly downward of the cover driver 590.

An opening 412b is formed at the rear upper surface portion 412 of the casing 410. The cover driver 590 moves the cover member 510 in the up-and-down direction by driving the cover member 510. Thus, the opening 412b is closed or opened. The opening 412b is opened, so that the substrate W can be carried into the casing 410 and the substrate W can be carried out from the casing 410. Details of the structure of the cover member 510 and an opening closing operation of the opening 412b by the cover member 510 will be described below.

Figure 8:
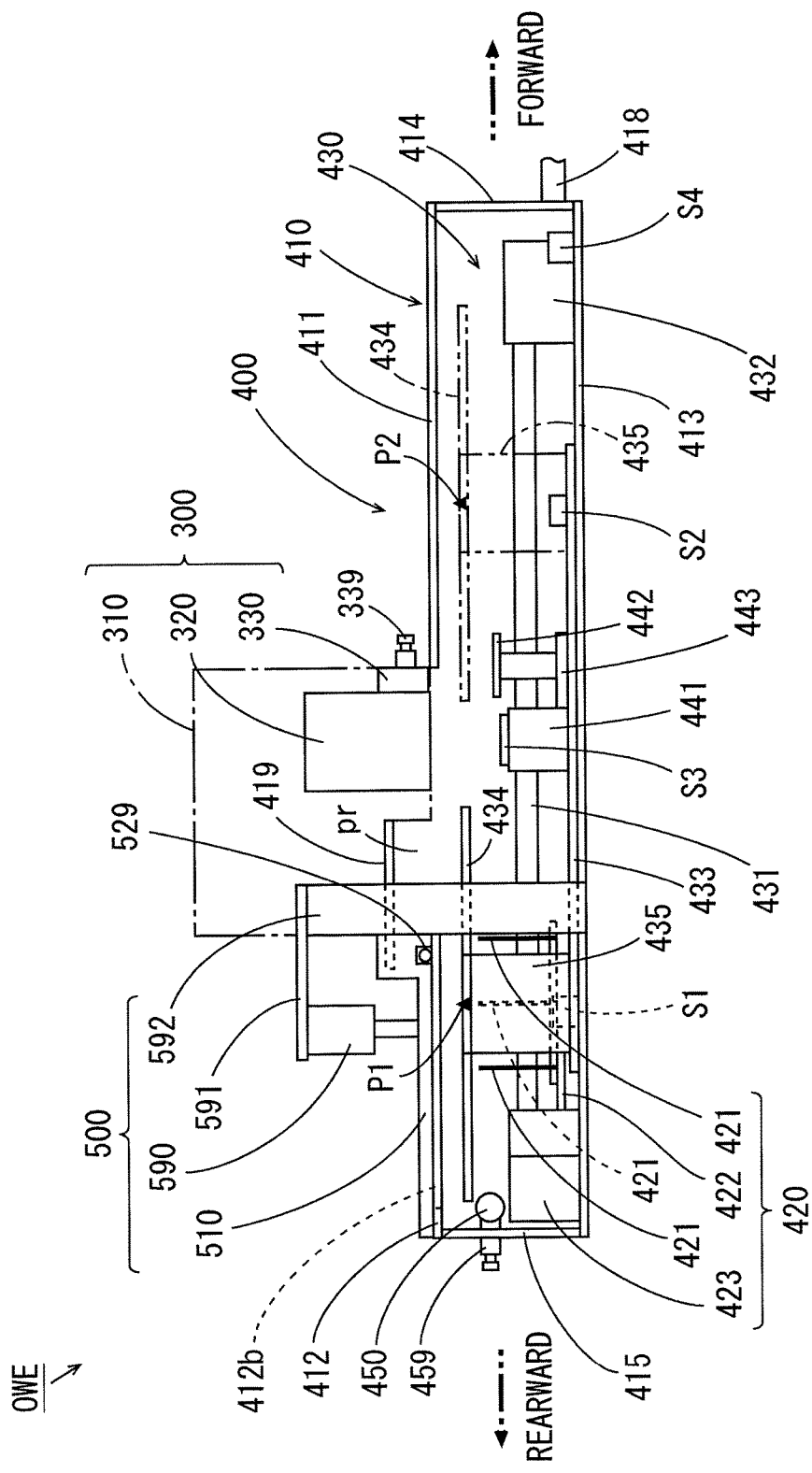
FIG. 8 is a side view for explaining inner structure of the exposure device.
Figure 9:
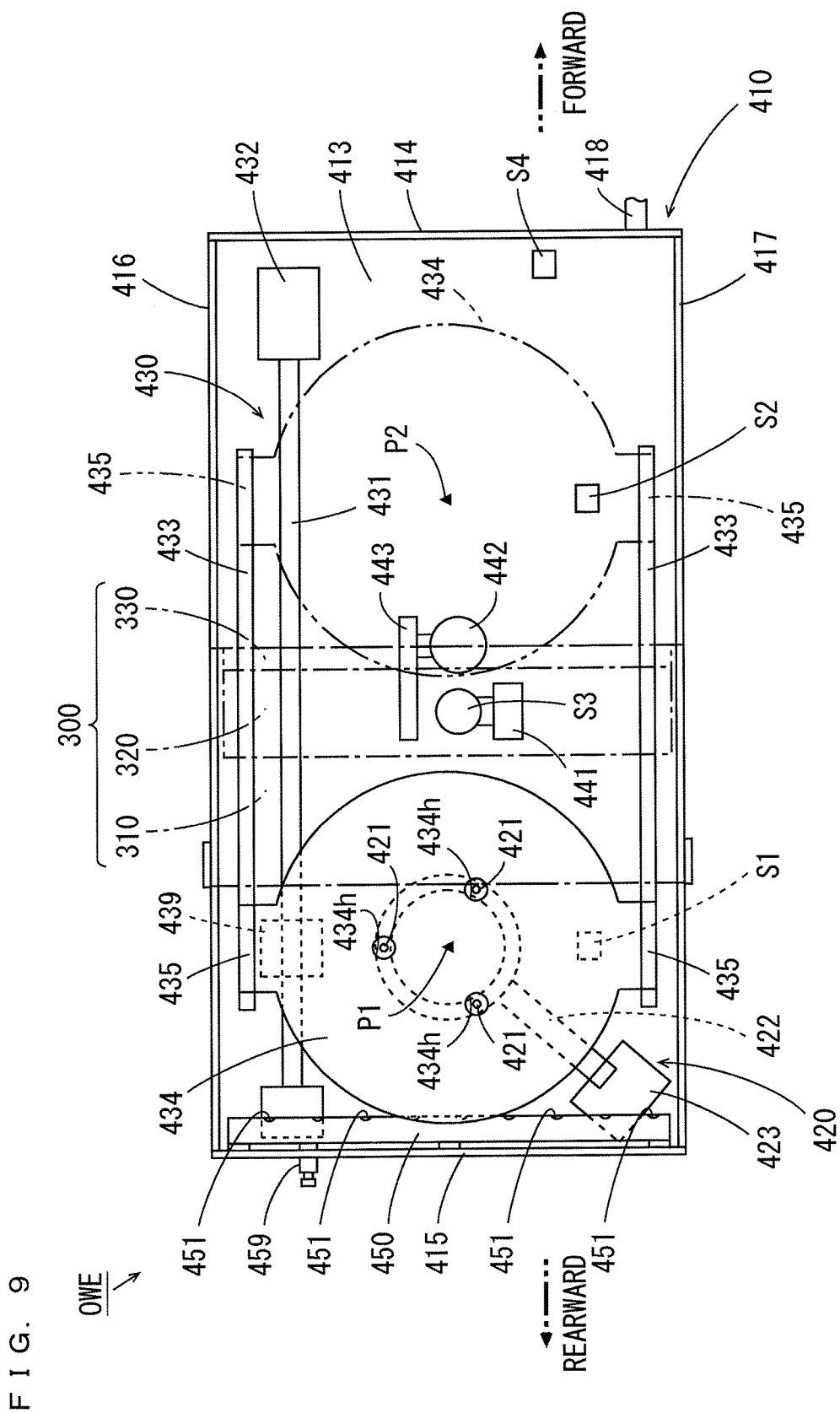
FIG. 9 is a plan view for explaining the inner structure of the exposure device.

FIG. 8 is a side view for explaining internal structure of the exposure device OWE, FIG. 9 is a plan view for explaining the internal structure of the exposure device OWE, and FIG. 10 is a front view for explaining the internal structure of the exposure device OWE.

In FIG. 8, a state of the exposure device OWE from which the other side surface portion 417 (FIG. 6) is removed is shown. In FIG. 9, a state of the exposure device OWE from which the front upper surface portion 411 (FIG. 6) and the rear upper surface portion 412 (FIG. 6) are removed is shown. In FIG. 10, a state of the exposure device OWE from which the front surface portion 414 (FIG. 6) is removed is shown. Further, in each of FIGS. 8 to 10, part or all of the structure of the light emitter 300 (FIG. 6) is indicated by a one-dot and dash line, and the casing 60 (FIG. 6) is not shown.

As shown in FIG. 8, a receiving transferring mechanism 420 and a local transport mechanism 430 are provided in the casing 410 of the substrate mover 400. The receiving transferring mechanism 420 includes a plurality of lifting pins 421, a pin support member 422 and a pin lifting lowering driver 423, and is arranged rearward of the light emitter 300.

The plurality of lifting pins 421 are attached to the pin support member 422 to respectively extend upward. The pin lifting lowering driver 423 supports the pin support member 422 to be movable in the up-and-down direction. In this state, the plurality of lifting pins 421 are arranged to overlap with the opening 412b of the rear upper surface portion 412. The receiving transferring mechanism 420 is controlled by the controller 114 of FIG. 1, for example. The pin lifting lowering driver 423 is operated, so that upper ends of the plurality of the lifting pins 421 are moved between receiving transferring positions upward of the rear upper surface portion 412 and waiting positions downward of a local transport hand 434, described below.

As shown in FIG. 9, the local transport mechanism 430 includes a feed shaft 431, a feed shaft motor 432, two guide rails 433, the local transport hand 434, two hand support members 435 and a coupling member 439.

In the casing 410, the feed shaft motor 432 is provided in the vicinity of the front surface portion 414. The feed shaft 431 is provided to extend in the front-and-rear direction from the feed shaft motor 432 to a position in the vicinity of the rear surface portion 415. The feed shaft 431 is a ball screw, for example, and is connected to a rotation shaft of the feed shaft motor 432.

One of the two guide rails 433 is provided to extend in the front-and-rear direction in the vicinity of the one side surface portion 416. Further, the other guide rail 433 is provided to extend in the front-and-rear direction in the vicinity of the other side surface portion 417. The feed shaft 431 and the two guide rails 433 are arranged to be parallel to each other.

The two hand support members 435 are respectively provided on the two guide rails 433 to be movable in the front-and-rear direction and extend upward. The two hand support members 435 have the common height. The local transport hand 434 is provided to connect the upper ends of the two hand support members 435. The local transport hand 434 is substantially circular plate members, and is supported by the two hand support members 435. The substrate W is placed on the local transport hand 434.

A plurality of through holes 434h are formed in each of the local transport hand 434. The plurality of through holes 434h are arranged at equal angular intervals to surround the center of the local transport hand 434. The plurality of lifting pins 421 of the receiving transferring mechanism 420 can be respectively inserted into the plurality of through holes 434h. Further, the coupling member 439 that couples the local transport hand 434 to the feed shaft 431 is provided at the lower surface of the local transport hand 434.

The local transport mechanism 430 is controlled by the controller 114 of FIG. 1, for example. The feed shaft motor 432 is operated, so that the feed shaft 431 is rotated. Thus, the local transport hand 434 moves in the front-and-rear direction between a rear position P1 rearward of the light emitter 300 and a front position P2 forward of the light emitter 300. In each of FIG. 8 and subsequent given diagrams, the center of the local transport hand 434 located at the rear position P1 and the center of the local transport hand 434 located at the front position P2 are indicated by black triangles. In each of FIG. 8 and FIG. 9, the local transport hand 434 being located at the front position P2 and the hand support members 435 are indicated by two-dots and dash lines.

With the upper ends of the plurality of lifting pins 421 of the receiving transferring mechanism 420 being located at the waiting positions and the local transport hand 434 being located at the rear position P1, the plurality of through holes 434h are respectively positioned on the plurality of lifting pins 421 of the receiving transferring mechanism 420.

As described above, the exposure processing for the substrate W using vacuum ultraviolet flux composed of vacuum ultraviolet rays is performed in the exposure device OWE of the present example. When oxygen is present in a path of the vacuum ultraviolet flux with which the substrate W is irradiated, an oxygen molecule that receives the vacuum ultraviolet rays is separated into oxygen atoms, and one of the separated oxygen atoms is re-coupled with another oxygen molecule, whereby ozone is generated. In this case, vacuum ultraviolet rays reaching the substrate W are attenuated. The attenuation of the vacuum ultraviolet rays is larger than the attenuation of ultraviolet rays having a wavelength longer than about 230 nm.

It is necessary to reduce an oxygen concentration in the path of the vacuum ultraviolet flux in order to reduce the attenuation of the vacuum ultraviolet rays. A first inert gas supplier 450 is provided in the casing 410. As shown in FIG. 9, the first inert gas supplier 450 is constituted by a pipe member with both ends closed, and is attached to an inner surface of the rear surface portion 415 to extend from the one side surface portion 416 to the other side surface portion 417.

As shown in FIG. 10, a plurality of injection holes 451 are formed in portions directed forward of the first inert gas supplier 450. The plurality of injection holes 451 are arranged at substantially equal intervals from the one end to the other end of the first inert gas supplier 450. Further, as shown in FIG. 8 and FIG. 9, one end of an inert gas inlet pipe 459 is connected to a portion directed rearward of the first inert gas supplier 450. The other end of the inert gas inlet pipe 459 is located outside of the casing 410.

An inert gas supply system (not shown) is connected to the other end of the inert gas inlet pipe 459. A gas outlet pipe 418 for discharging an atmosphere in the casing 410 to the outside of the casing 410 is provided at the front surface portion 414 of the casing 410. An inert gas supplied from the inert gas supply system to the inert gas inlet pipe 459 is injected into the casing 410 from the plurality of injection holes 451 through an inner space of the first inert gas supplier 450. At this time, the atmosphere in the casing 410 is discharged from the gas outlet pipe 418 to the outside of the casing 410. Thus, the atmosphere in the casing 410 is replaced by an inert gas, and the oxygen concentration is reduced. In the present embodiment, a nitrogen gas is used as the inert gas.

As shown in FIG. 8, a rear position sensor S1, a front position sensor S2, an illumination intensity sensor S3 and an oxygen concentration sensor S4 are further provided in the casing 410. The rear position sensor S1 detects whether the local transport hand 434 is located at the rear position P1, and supplies a result of detection to the controller 114 of FIG. 1. The front position sensor S2 detects whether the local transport hand 434 is located at the front position P2, and supplies a result of detection to the controller 114 of FIG. 1. As the rear position sensor S1 and the front position sensor S2, an optical sensor, for example, is used.

The oxygen concentration sensor S4 detects the oxygen concentration in the casing 410, and supplies a result of detection to the controller 114 of FIG. 1. As the oxygen concentration sensor S4, a galvanic cell type oxygen sensor, a zirconia oxygen sensor or the like is used.

The illumination intensity sensor S3 includes a light receiving element such as a photo diode, and detects illumination intensity of light with which a light receiving surface of the light receiving element is irradiated. The illumination intensity is a work rate of light with which the light receiving surface is irradiated per unit area. A unit of illumination intensity is represented by "W/m$^2$", for example. In the present embodiment, the illumination intensity detected by the illumination intensity sensor S3 is equivalent to illumination intensity of the vacuum ultraviolet rays with which the substrate W moved between the rear position P1 and the front position P2 by the local transport hand 434 is irradiated, that is, illumination intensity of the vacuum ultraviolet rays with which the substrate W is irradiated during the exposure processing. Further, the illumination intensity sensor S3 is supported at a position opposite to an emission surface 321 (FIG. 14), described below, of the light emitter 300 to be movable in the up-and-down direction by a sensor lifting lowering driver 441. The sensor lifting lowering driver 441 is controlled by the controller 114 of FIG. 1, for example.

As shown in FIG. 9 and FIG. 10, a light blocking member 442 and a light blocking driver 443 are provided in the vicinity of the illumination intensity sensor S3. The light blocking member 442 has an outer shape larger than the light receiving element of the illumination intensity sensor S3. The light blocking driver 443 supports the light blocking member 442 at a position (height) between the illumination intensity sensor S3 and the light emitter 300 in the up-and-down direction to be movable in the front-and-rear direction. The light blocking driver 443 is controlled by the controller 114 of FIG. 1, for example. Details of operations of the sensor lifting lowering driver 441 and the light blocking driver 443 will be described below.

Figure 11:
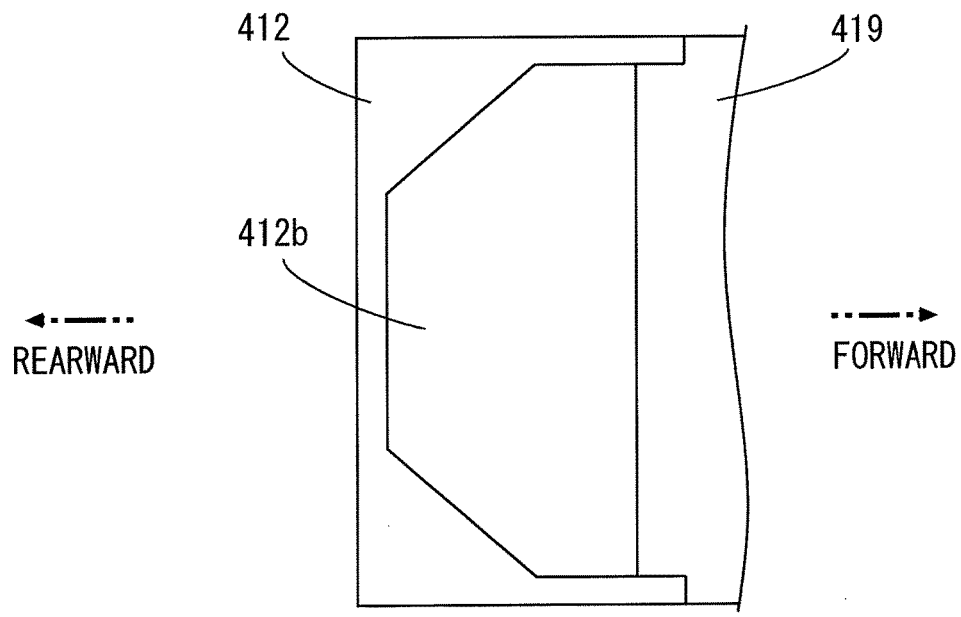
FIG. 11 is a plan view of a rear upper surface portion and a central upper surface portion.

Next, configuration of the rear upper surface portion 412, the central upper surface portion 419 of the casing 410, and the cover member 510 of the carry-in carry-out mechanism 500 of FIG. 6 will be described. FIG. 11 is a plan view of the rear upper surface portion 412 and the central upper surface portion 419, and FIG. 12 is a bottom view of the cover member 510.

As shown in FIG. 11, when the rear upper surface portion 412 and the central upper surface portion 419 are viewed from above, the opening 412b is surrounded by a front edge of the rear upper surface portion 412 and a rear edge of the central upper surface portion 419. The cover member 510 has an outer shape slightly larger than the opening 412b. Further, the lower surface of the cover member 510 is formed such that a region 510d, except for the both ends, having a constant width from part of the front edge is higher than the other region by a constant height.

When the opening 412b is closed by the cover member 510, a region 510c, of the cover member 510 except for the front edge of the lower surface, having a constant width from the outer edge abuts against the upper surface of the rear upper surface portion 412. Further, the region 510d of the lower surface of the cover member 510 abuts against the upper surface of the central upper surface portion 419. That is, a lower surface of the cover member 510 comes into contact with a region surrounding the opening 412b of the rear upper surface portion 412 and the central upper surface portion 419. Thus, a gap is not generated between the casing 410 and the cover member 510. Therefore, a hermetic state in the casing 410 is improved with a simple configuration.

Figure 12:
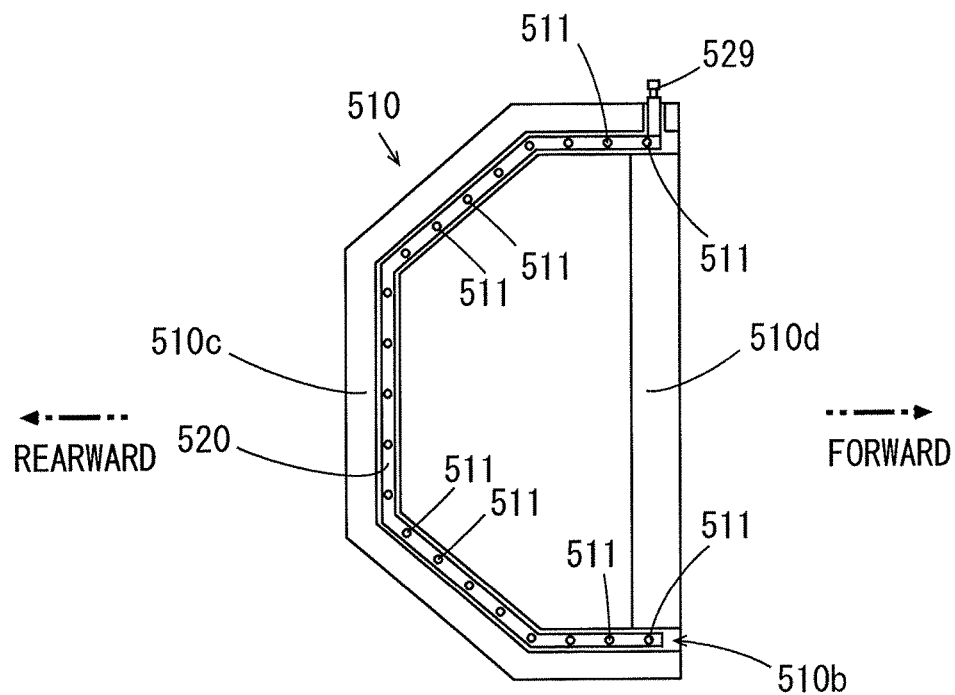
FIG. 12 is a bottom view of a cover member.

As shown in FIG. 12, a groove 510b having a substantially constant width is formed at the lower surface of the cover member 510 to extend along an inner edge of the region 510c. A second inert gas supplier 520 is provided in the groove 510b. The second inert gas supplier 520 is constituted by a pipe member with its one end closed. A plurality of injection holes 511 are formed in portions directed downward of the pipe member. The plurality of injection holes 511 are arranged at substantially equal intervals. Further, one end of an inert gas inlet pipe 529 is connected to the other end of the second inert gas supplier 520. The other end of the inert gas inlet pipe 529 projects sideward of the cover member 510. An inert gas supply system (not shown) is connected to the other end of the inert gas inlet pipe 529.

When the opening 412b is opened by the cover member 510, the region 510c at the lower surface of the cover member 510 is opposite to the upper surface of the rear upper surface portion 412 at a position directly upward of the rear upper surface portion 412. Further, the region 510d of the lower surface of the cover member 510 is opposite to the upper surface of the central upper surface portion 419 at a position directly upward of the central upper surface portion 419. In this state, an inert gas is supplied from the inert gas supply system to the inert gas inlet pipe 529.

Figure 13:
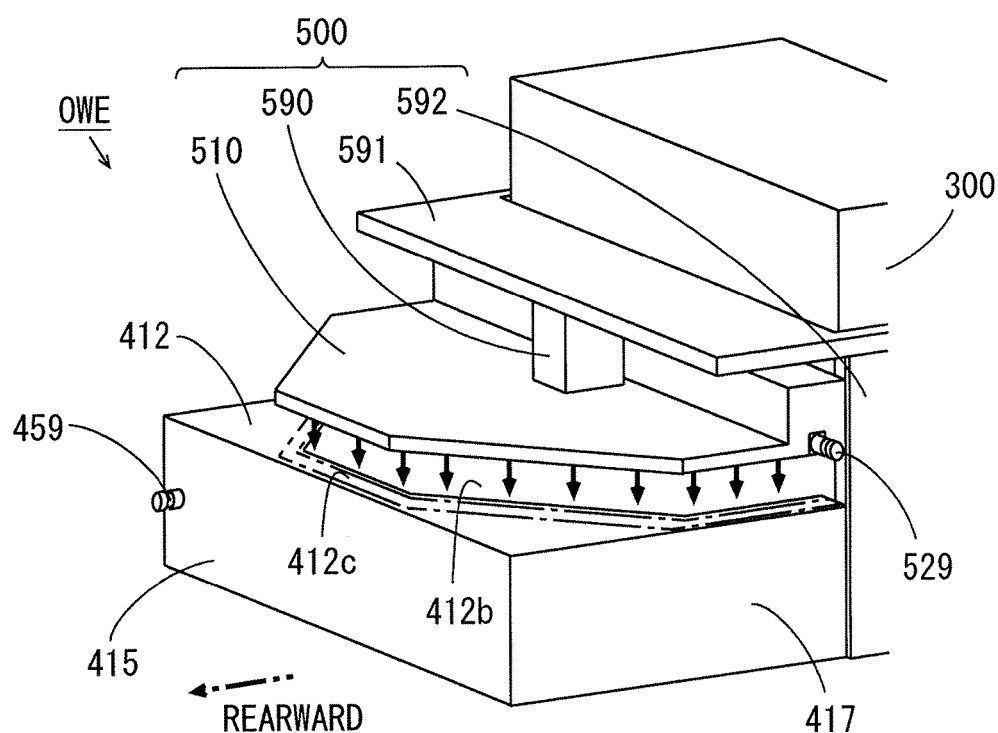
FIG. 13 is an external perspective view of the exposure device showing an opening of the casing being opened.

FIG. 13 is an external perspective view of the exposure device OWE showing the opening 412b of the casing 410 being open. In FIG. 13, only the carry-in carry-out mechanism 500 of the exposure device OWE and its periphery are shown.

As indicated by thick solid arrows in FIG. 13, the inert gas supplied to the inert gas inlet pipe 529 with the opening 412b being open is injected downward from the plurality of injection holes 511 (FIG. 12) of the second inert gas supplier 520 (FIG. 12). The inert gas injected from the plurality of injection holes 511 (FIG. 12) flows into the casing 410 via a position in the vicinity of an inner edge of the opening 412b.

In this case, a downward flow of the inert gas from the lower surface of the cover member 510 is formed along the inner edge portion of the opening 412b. The formed flow of the inert gas cuts off a flow of an atmosphere between a space directly downward of the cover member 510 and outside of the space. Thus, an atmosphere outside of the casing 410 is prevented from entering the casing 410 through the opening 412b. Further, the atmosphere in the casing 410 is inhibited from leaking to the outside of the casing 410 through the opening 412b.

Next, the configuration of the light emitter 300 will be described. As shown in FIGS. 8 to 10, the light emitter 300 includes a casing 310, an ultraviolet ray lamp 320 and a third inert gas supplier 330. In each of FIGS. 8 and 10, the casing 310 is indicated by a one-dot and dash line. In FIG. 9, the casing 310, the ultraviolet ray lamp 320 and the third inert gas supplier 330 are indicated by one-dot and dash lines. A driving circuit, a wiring, a connection terminal and the like of the ultraviolet ray lamp 320 are stored in the casing 310 together with the ultraviolet ray lamp 320 and the third inert gas supplier 330. The light emitter 300 is controlled by the controller 114 of FIG. 1, for example.

The ultraviolet ray lamp 320 and the third inert gas supplier 330 have a rectangular parallelepiped shape respectively extending in one direction. As indicated by the one-dot dash lines in FIG. 9, measurements in a longitudinal direction of the ultraviolet ray lamp 320 and the third inert gas supplier 330 are equal to each other and are respectively substantially equal to a distance between the one side surface portion 416 and the other side surface portion 417.

In the present example, a xenon excimer lamp that generates vacuum ultraviolet rays having a wavelength of 172 nm is used as the ultraviolet ray lamp 320. The ultraviolet ray lamp 320 may be a lamp that generates vacuum ultraviolet rays having a wavelength of not more than 230 nm, and another excimer lamp, a deuterium lamp or the like may be used instead of the xenon excimer lamp.

Figure 14A:
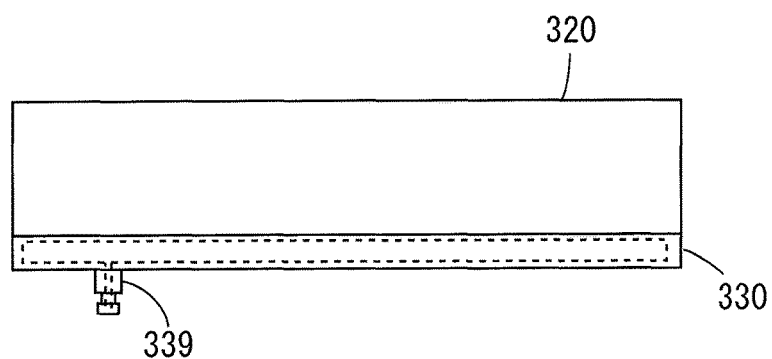
FIG. 14A is a plan view of an ultraviolet ray lamp and a third inert gas supplier.
Figure 14B:
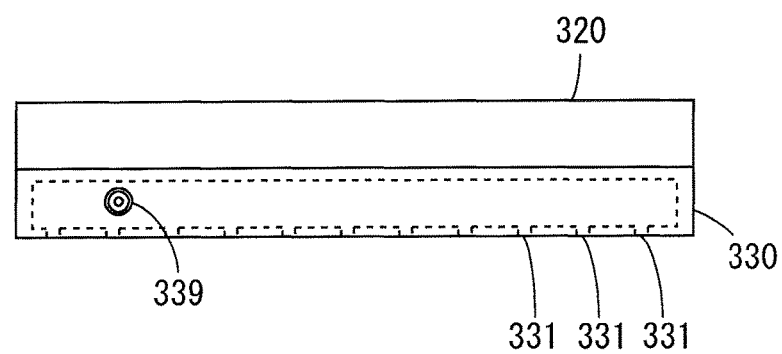
FIG. 14B is a front view of the ultraviolet ray lamp and the third inert gas supplier.
Figure 14C:
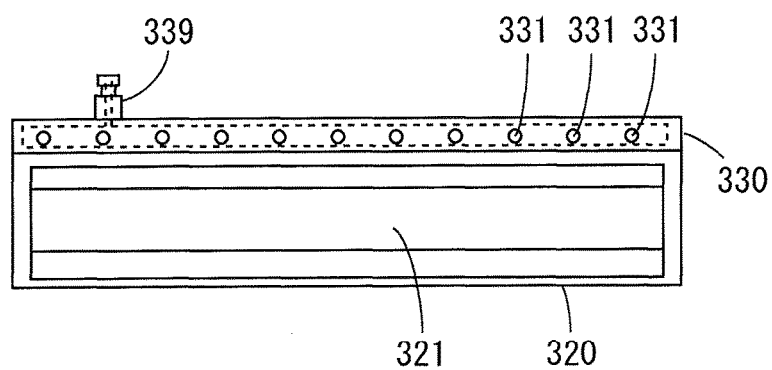
FIG. 14C is a bottom view of the ultraviolet ray lamp and the third inert gas supplier.

FIG. 14A is a plan view of the ultraviolet ray lamp 320 and the third inert gas supplier 330, FIG. 14B is a front view of the ultraviolet ray lamp 320 and the third inert gas supplier 330, and FIG. 14C is a bottom view of the ultraviolet ray lamp 320 and the third inert gas supplier 330.

As shown in FIG. 14C, the emission surface 321 of the vacuum ultraviolet flux is formed at the lower surface of the ultraviolet ray lamp 320 to extend from one end to the other end of the ultraviolet ray lamp 320. During a period in which the ultraviolet ray lamp 320 is turned on, the vacuum ultraviolet flux is emitted downward from the emission surface 321. The vacuum ultraviolet flux emitted from the ultraviolet ray lamp 320 has a strip-shaped cross section orthogonal to an advancing direction (the up-and-down direction in the present example).

The ultraviolet ray lamp 320 is arranged such that the strip-shaped vacuum ultraviolet flux crosses a moving path of the substrate W placed on the local transport hand 434 of FIG. 9. In this case, the local transport hand 434 (FIG. 9) moves between the rear position P1 (FIG. 9) and the front position P2 (FIG. 9) at a constant moving speed with the strip-shaped vacuum ultraviolet flux being emitted from the ultraviolet ray lamp 320, whereby the strip-shaped vacuum ultraviolet flux is scanned from one end to the other end of the substrate W. Thus, the entire region of the upper surface of the substrate W is irradiated with the vacuum ultraviolet rays.

As shown in FIGS. 14A to 14C, the third inert gas supplier 330 is attached to the lower end of the front surface of the ultraviolet ray lamp 320. The third inert gas supplier 330 has a square tube shape with the both ends closed.

As shown in FIGS. 14B, 14C, a plurality of injection holes 331 are formed in portions directed downward of the third inert gas supplier 330. The plurality of injection holes 331 are arranged at substantially equal intervals from the one end to the other end of the third inert gas supplier 330. Further, one end of an inert gas inlet pipe 339 is connected to a front surface of the third inert gas supplier 330. An inert gas supply system (not shown) is connected to the other end of the inert gas inlet pipe 339.

During the exposure processing for the substrate W, an inert gas is supplied to the inert gas inlet pipe 339 from the inert gas supply system. The inert gas supplied to the inert gas inlet pipe 339 is injected into the casing 410 of FIG. 8 from the plurality of injection holes 331 through an inner space of the third inert gas supplier 330.

As shown in FIG. 14C, the plurality of injection holes 331 are adjacent to the emission surface 321 of the ultraviolet ray lamp 320. Therefore, during the exposure processing for the substrate W, the oxygen concentration of the path of the vacuum ultraviolet flux with which the substrate W is irradiated can be more sufficiently reduced. Therefore, attenuation of the vacuum ultraviolet rays with which the substrate W is irradiated can be more sufficiently inhibited. Thus, a reduction in processing efficiency of the exposure is inhibited.

In the following description, energy of the vacuum ultraviolet rays with which the upper surface of the substrate W is irradiated per unit area during the exposure processing is referred to as an exposure value. A unit of the exposure value is represented by "$J/m^2$", for example. The attenuation of the vacuum ultraviolet rays with which the upper surface of the substrate W is irradiated from the ultraviolet ray lamp 320 increases as the path of the vacuum ultraviolet rays between the ultraviolet ray lamp 320 and the substrate W becomes larger in addition to the oxygen concentration. Therefore, when the upper surface of the substrate W tilts with respect to the emission surface 321 of the ultraviolet ray lamp 320 (FIGS. 14A to 14C), differences in exposure value are generated at a plurality of positions of the upper surface of the substrate W.

In the present embodiment, the ultraviolet ray lamp 320 is arranged to extend in a direction orthogonal to the front-and-rear direction in a horizontal plane (hereinafter referred to as a right-and-left direction). Further, the local transport hand 434 is provided to connect the upper ends of the two hand support members 435 as shown in FIG. 10. With the substrate W being placed on the local transport hand 434, the two hand support members 435 are arranged to be opposite to each other with the center of the substrate W being sandwiched therebetween in the right-and-left direction. The two hand support members 435 have a common height, so that the height of the local transport hand 434 is constant in the right-and-left direction in which the two hand support members 435 are arranged.

From these, in the right-and-left direction, a distance between the substrate W placed on the local transport hand 434 and the ultraviolet ray lamp 320 is kept constant. Thus, during the exposure processing for the substrate W, the entire upper surface of the substrate W is evenly irradiated with vacuum ultraviolet rays. Therefore, generation of variations in distribution of the exposure value is prevented.

[4] Exposure Conditions

In the present embodiment, in an exposure condition of the substrate W by the exposure device OWE, an oxygen concentration in the casing 410 and a moving speed of the substrate W by the local transport hand 434 are included.

The oxygen concentration in the casing 410 during the exposure processing is set to be lower than 1%, for example. In this case, when the oxygen concentration detected by the oxygen concentration sensor S4 of FIG. 8 is lower than 1%, the exposure processing for the substrate W is performed. Thus, large attenuation of the vacuum ultraviolet rays with which the substrate W is irradiated caused by oxygen is inhibited. Further, ozone generated during the exposure processing can be reduced by oxygen that remains in the path of the vacuum ultraviolet flux. On the one hand, if the oxygen concentration detected by the oxygen concentration sensor S4 of FIG. 8 is not less than 1%, the exposure processing for the substrate W is not performed.

An exposure value is determined in advance for every substrate W or for every type of the substrate W based on the processing contents for the substrate W. The predetermined exposure value is stored in the controller 114 of FIG. 1 as the set exposure value before the exposure processing for the substrate W.

As described above, when the strip-shape vacuum ultraviolet flux is scanned from one end to the other end of the substrate W at a constant speed, it is possible to adjust the exposure value for the substrate W by controlling the moving speed of the substrate W. For example, it is possible to reduce the exposure value by increasing the moving speed of the substrate W, and it is possible to increase the exposure value by reducing the moving speed of the substrate W, for example. Here, a constant relationship exists among the exposure value for the substrate W, illumination intensity of the vacuum ultraviolet rays with which the substrate W is irradiated, and the moving speed of the substrate W.

In the present embodiment, the illumination intensity of the vacuum ultraviolet rays of the vacuum ultraviolet flux with which the substrate W is to be irradiated during the exposure processing is detected by the illumination intensity sensor S3 by illumination intensity measurement in advance before the exposure processing, described below. In this case, when letting the illumination intensity detected by the illumination intensity sensor S3 be IL ($W/m^2$ (=$J/sec \cdot m^2$)), letting the set exposure value be SA ($J/m^2$), and letting a length of the cross sections of the vacuum ultraviolet flux emitted from the ultraviolet ray lamp 320 in a moving direction of the substrate W (an irradiation width) be EW (m), the moving speed V of the substrate W required to acquire the set exposure value (m/sec) is expressed by a following formula (1).

$$V=(EW \times IL)/SA \quad (1)$$

The moving speed of the substrate W is calculated by the controller 114 based on the above-mentioned formula (1). With the vacuum ultraviolet flux being emitted from the light emitter 300, the substrate mover 400 is controlled such that the local transport hand 434 is moved from the front position P2 to the rear position P1 (or from the rear position P1 to the front position P2) at a calculated moving speed.

In this manner, feedback control of the moving speed of the substrate W is performed based on the illumination intensity detected by the illumination intensity sensor S3 such that the exposure value for the substrate W is the set exposure value. Thus, the exposure value of the vacuum ultraviolet rays with which the substrate W is irradiated is accurately adjusted.

[5] Exposure Processing Operation

FIGS. 15 to 22 are side views for explaining an exposure processing operation for the substrate W in the exposure device OWE. In FIGS. 15 to 22, similarly to the side view of FIG. 8, a state of the exposure device OWE from which the casing 60 (FIG. 6) and the other side surface portion 417 (FIG. 6) are removed is shown. In FIGS. 17 to 22, the substrate W is indicated by hatching such that each constituent element of the substrate mover 400 and the substrate W are easily identified from each other.

Figure 15:
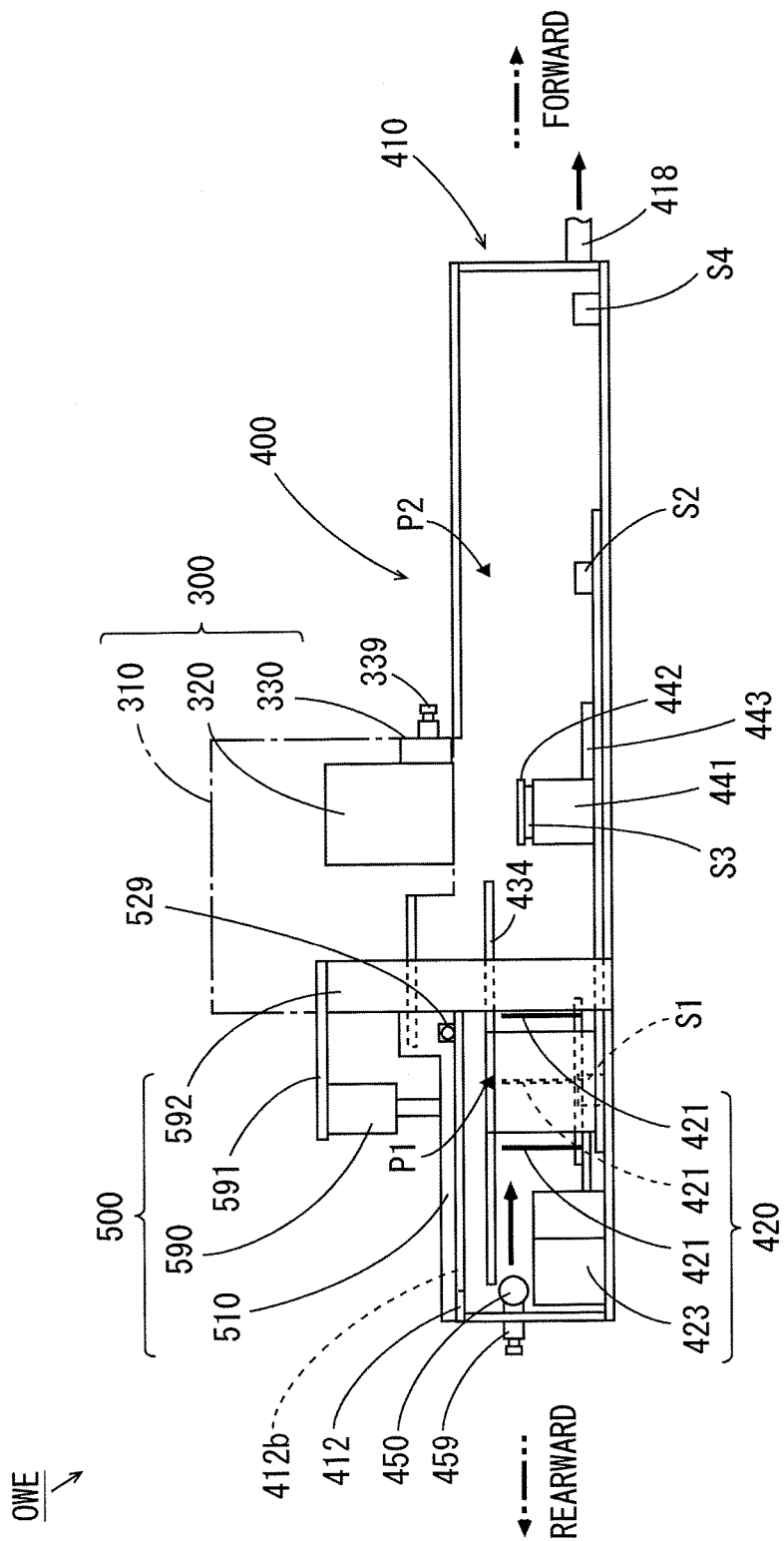
FIG. 15 is a side view for explaining an exposure processing operation for the substrate in the exposure device.

In the initial state, as shown in FIG. 15, the local transport hand 434 is located at the rear position P1, and the upper ends of the plurality of lifting pins 421 are located at the waiting positions. Further, the opening 412b of the casing 410 is closed, and the ultraviolet ray lamp 320 is in an OFF state. Further, as indicated by a thick solid arrow in FIG. 15, an inert gas is supplied from the first inert gas supplier 450 to the casing 410.

An inert gas is supplied from the first inert gas supplier 450 to the inside of the casing 410, so that the oxygen concentration in the casing 410 is reduced. Thus, the oxygen concentration in the casing 410 is kept lower than 1%, for example.

Figure 16:
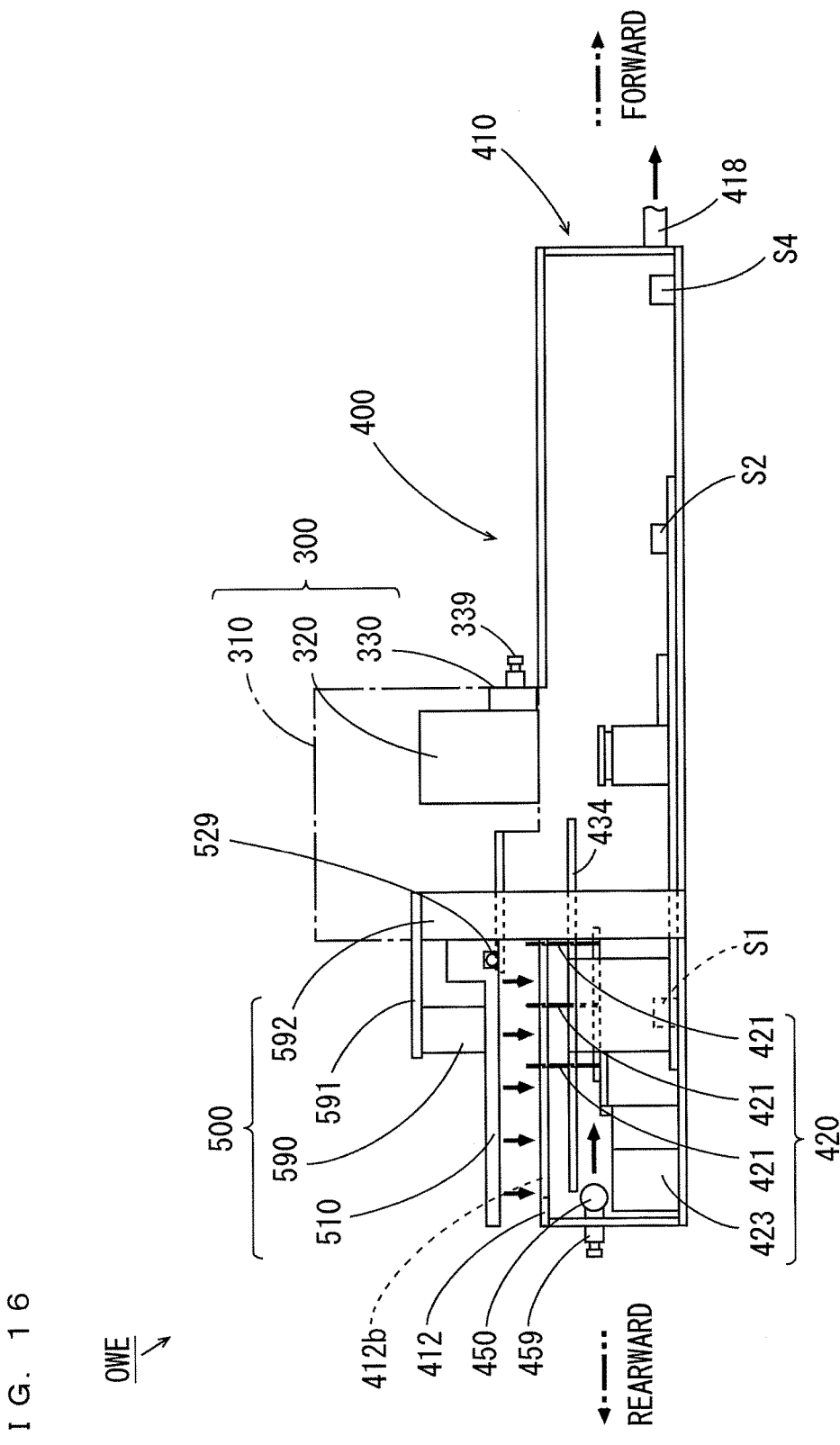
FIG. 16 is a side view for explaining the exposure processing operation for the substrate in the exposure device.

As shown in FIG. 16, the opening 412*b* is opened by lifting of the cover member 510 in order to carry the substrate W into the casing 410. At this time, an inert gas is supplied from the lower surface of the cover member 510 to the opening 412*b* by the second inert gas supplier 520 of FIG. 12 (see FIG. 13). Thus, an atmosphere outside of the casing 410 is prevented from entering the casing 410 through the opening 412*b* as described above. Further, the plurality of lifting pins 421 of the receiving transferring mechanism 420 are lifted. Thus, the upper ends of the plurality of lifting pins 421 are moved from the waiting positions to the receiving transferring positions.

Figure 17:
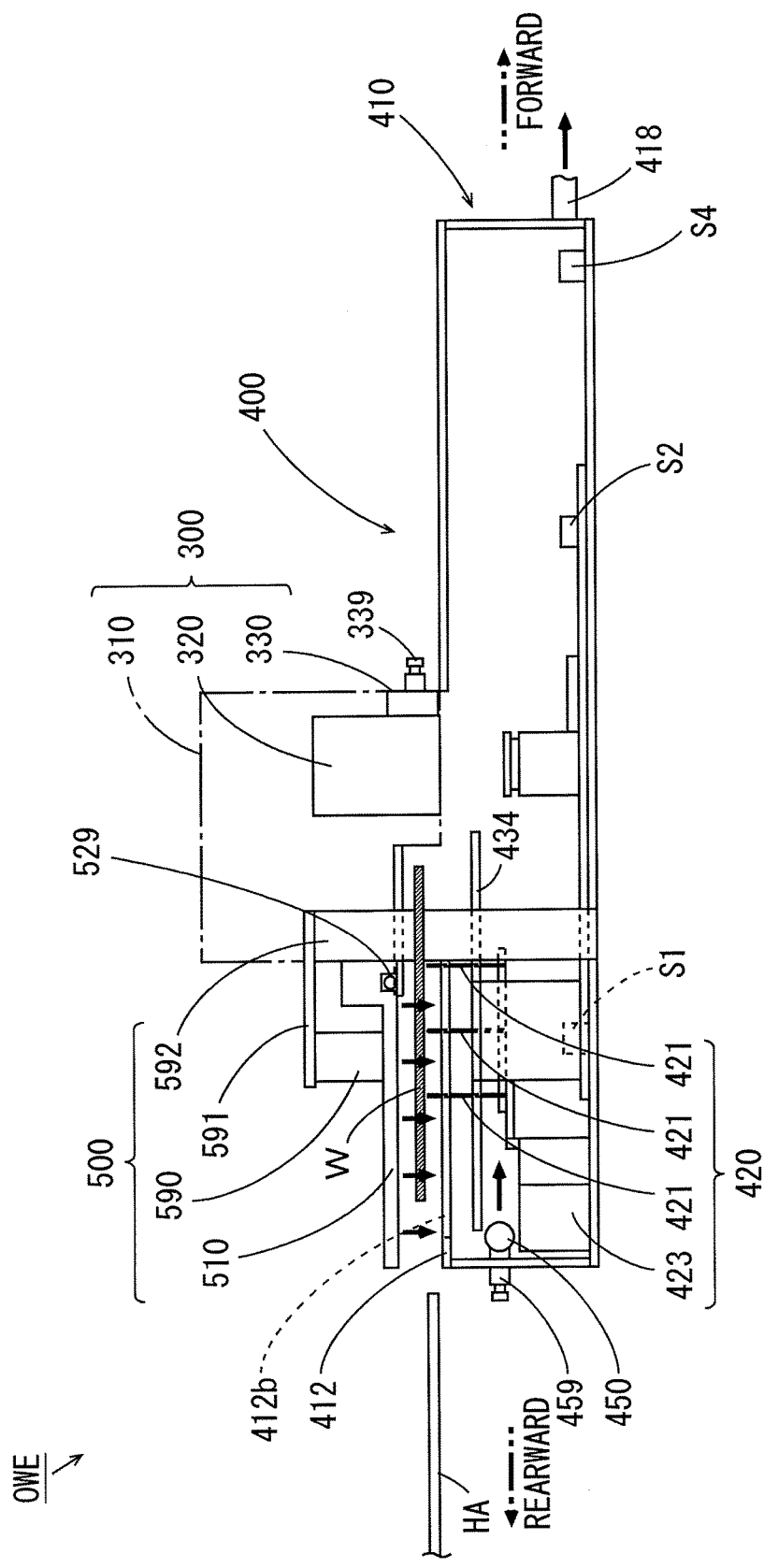
FIG. 17 is a side view for explaining the exposure processing operation for the substrate in the exposure device.
Figure 18:
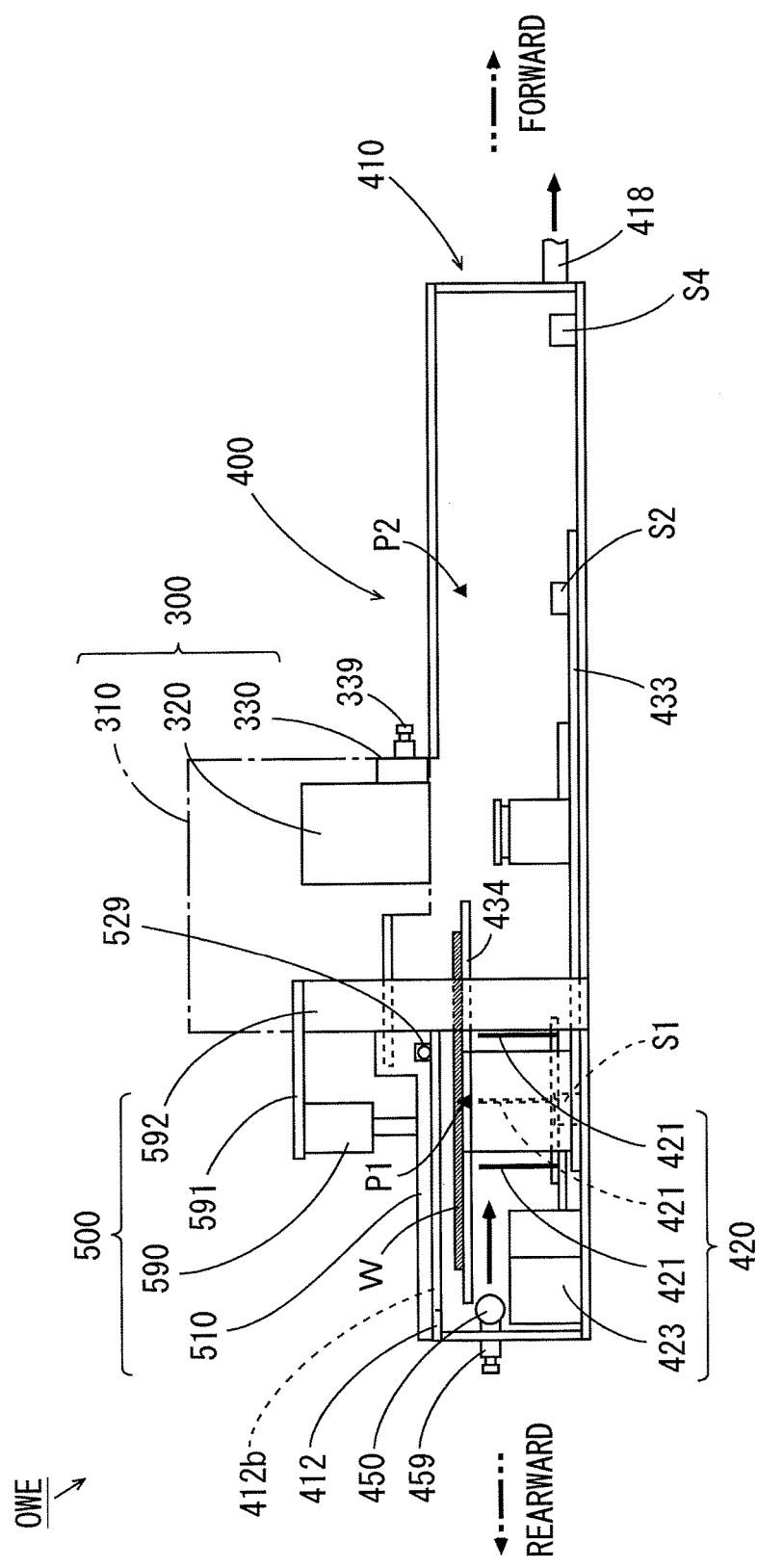
FIG. 18 is a side view for explaining the exposure processing operation for the substrate in the exposure device.

Next, as shown in FIG. 17, the substrate W in the horizontal attitude is inserted in a horizontal direction into a gap between the cover member 510 and the opening 412*b* and placed on the plurality of lifting pins 421 by a hand HA of any of the transport mechanisms 127, 128 of FIG. 4. Subsequently, the plurality of lifting pins 421 of the receiving transferring mechanism 420 are lowered. Thus, as shown in FIG. 18, the upper ends of the plurality of lifting pins 421 are moved from the receiving transferring positions to the waiting positions, and the substrate W in the horizontal attitude is moved to the inside of the casing 410 through the opening 412*b*. At this time, the substrate W is transferred from the plurality of lifting pins 421 to the local transport hand 434. Further, the cover member 510 is lowered, so that the opening 412*b* is closed, and the supply of the inert gas by the second inert gas supplier 520 of FIG. 12 is stopped.

Figure 19:
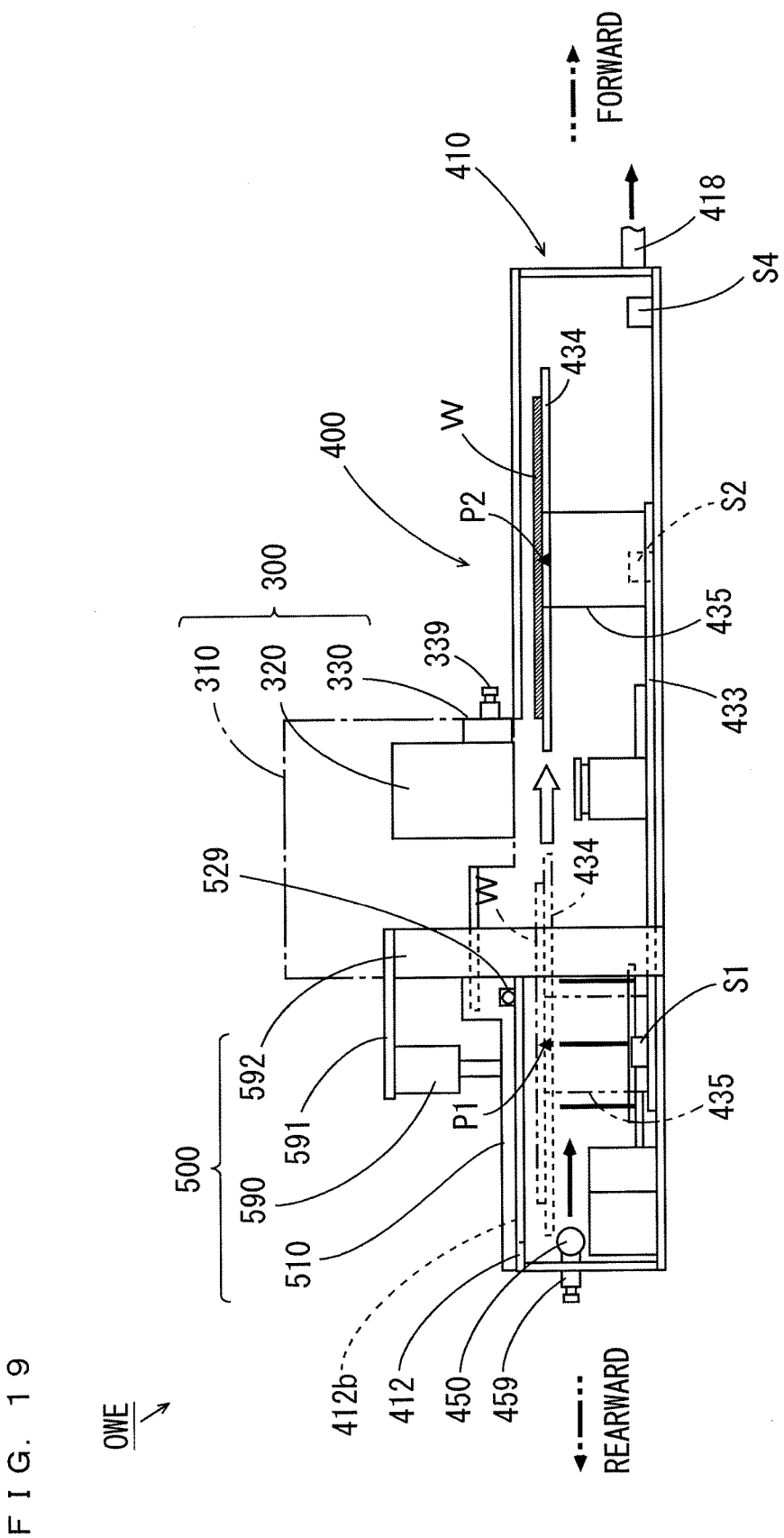
FIG. 19 is a side view for explaining the exposure processing operation for the substrate in the exposure device.
Figure 20:
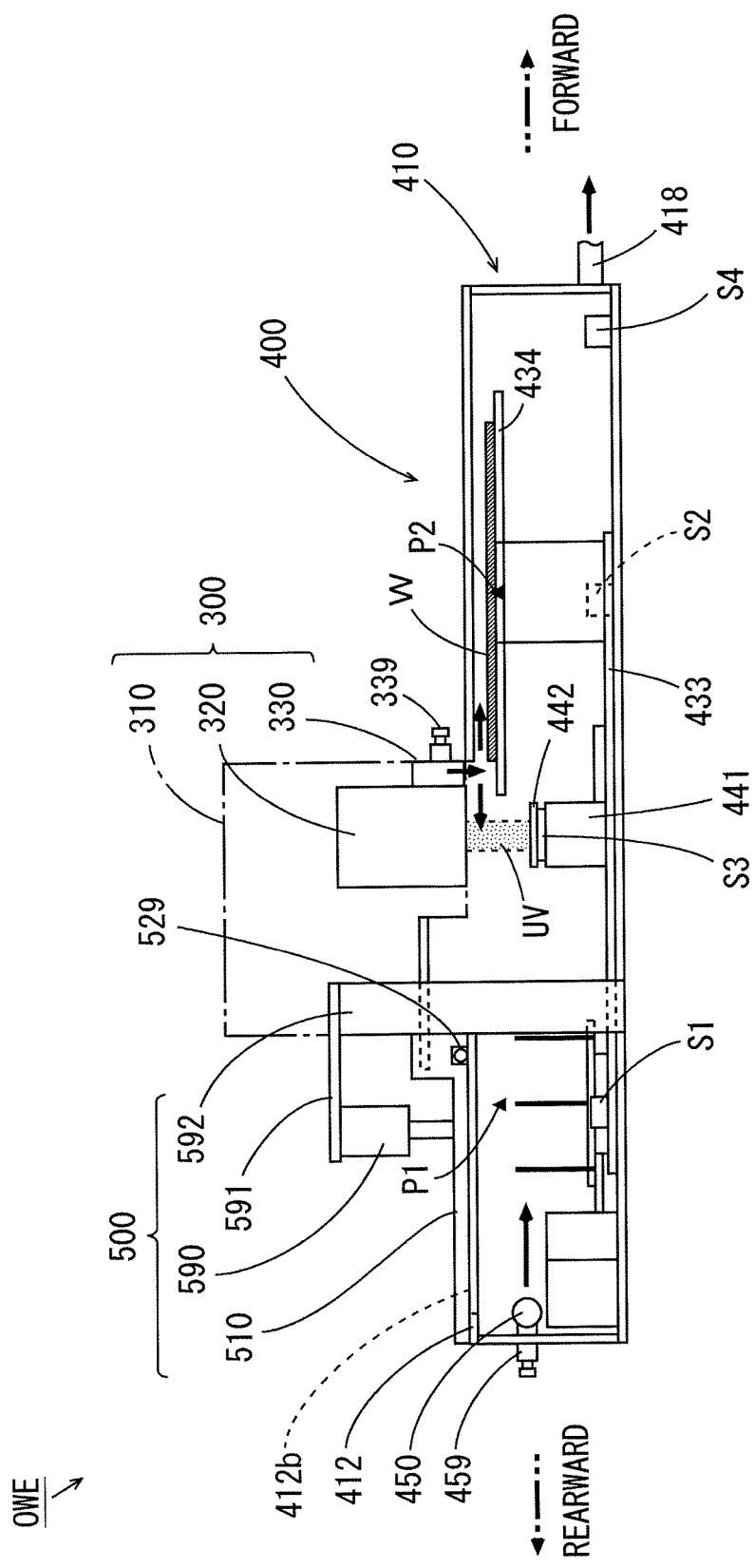
FIG. 20 is a side view for explaining the exposure processing operation for the substrate in the exposure device.

Next, as indicated by an outlined arrow in FIG. 19, the local transport hand 434 is moved from the rear position P1 to the front position P2. At this time, the ultraviolet ray lamp 320 is in the OFF state, so that the substrate W is not exposed.

Thereafter, whether the local transport hand 434 is located at the front position P2 is determined by the controller 114 of FIG. 1 based on a result of detection of the front position sensor S2. Further, whether the oxygen concentration detected by the oxygen concentration sensor S4 is lower than 1% is determined by the controller 114 of FIG. 1.

When the local transport hand 434 is located at the front position P2 and the oxygen concentration is lower than 1%, the ultraviolet ray lamp 320 is switched from the OFF state to an ON state. Thus, as indicated by a dotted pattern in FIG. 20, the vacuum ultraviolet flux UV is emitted downward from the ultraviolet ray lamp 320. The vacuum ultraviolet flux UV has a strip-shape cross section having a length longer than a diameter of the substrate W and extending in the right-and-left direction.

Further, an inert gas is supplied from the third inert gas supplier 330 to the inside of the casing 410. The inert gas supplied from the third inert gas supplier 330 collides with part of the local transport hand 434 or part of the substrate W, and flows in a space directly upward of the substrate W.

Figure 21:
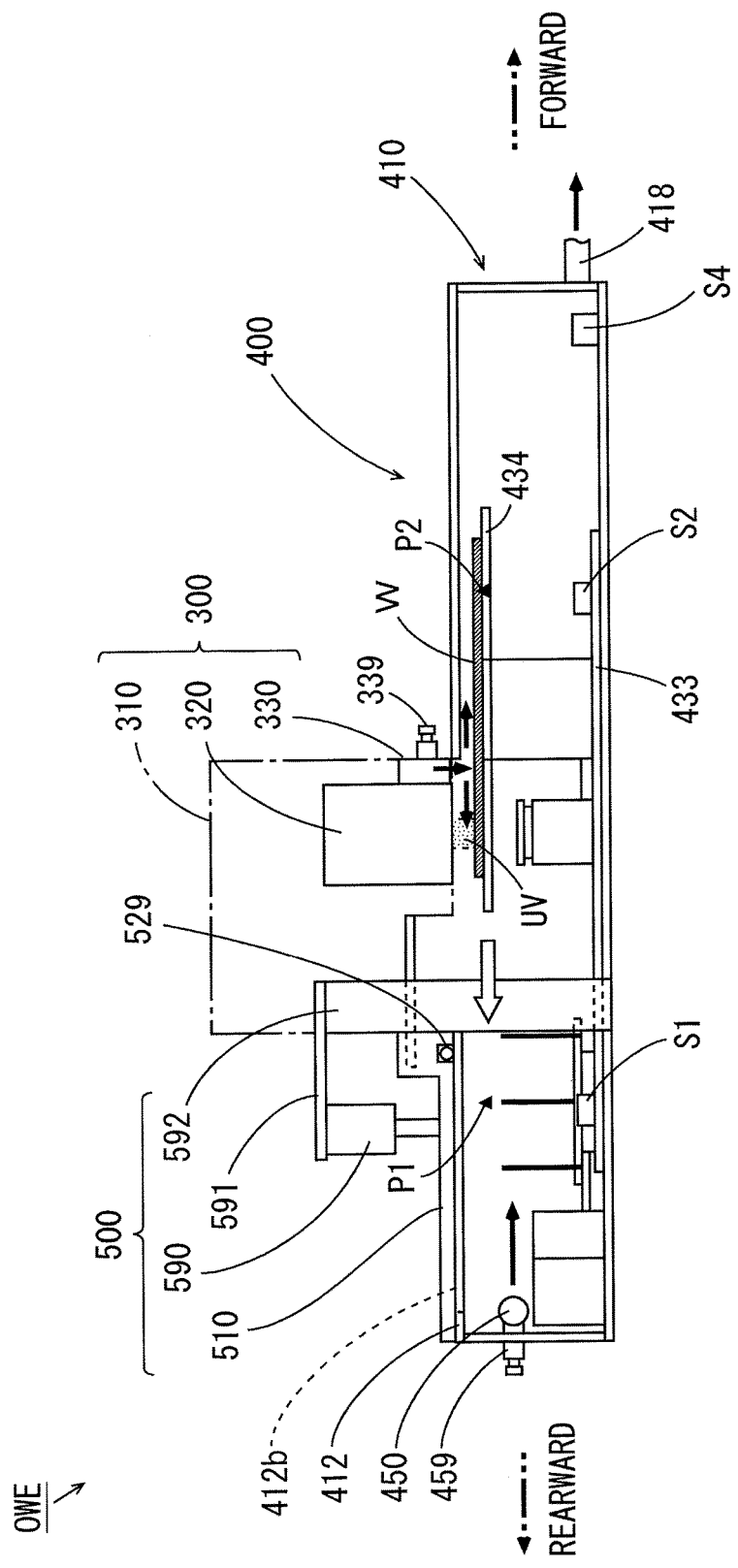
FIG. 21 is a side view for explaining the exposure processing operation for the substrate in the exposure device.

Then, as indicated by an outlined arrow in FIG. 21, the local transport hand 434 is moved from the front position P2 to the rear position P1. The moving speed at this time is controlled to be constant and the speed calculated in advance using the above-mentioned formula (1). Thus, as described above, the entire region of the upper surface of the substrate W is exposed with the set exposure value.

Thereafter, whether the local transport hand 434 is located at the rear position P1 is determined by the controller 114 of FIG. 1 based on the result of detection of the rear position sensor S1. When the local transport hand 434 is located at the rear position P1, the ultraviolet ray lamp 320 is switched from the ON state to the OFF state. Further, the supply of the inert gas by the third inert gas supplier 330 is stopped. The state of the exposure device OWE at this time is the same as the example of FIG. 18.

Figure 22:
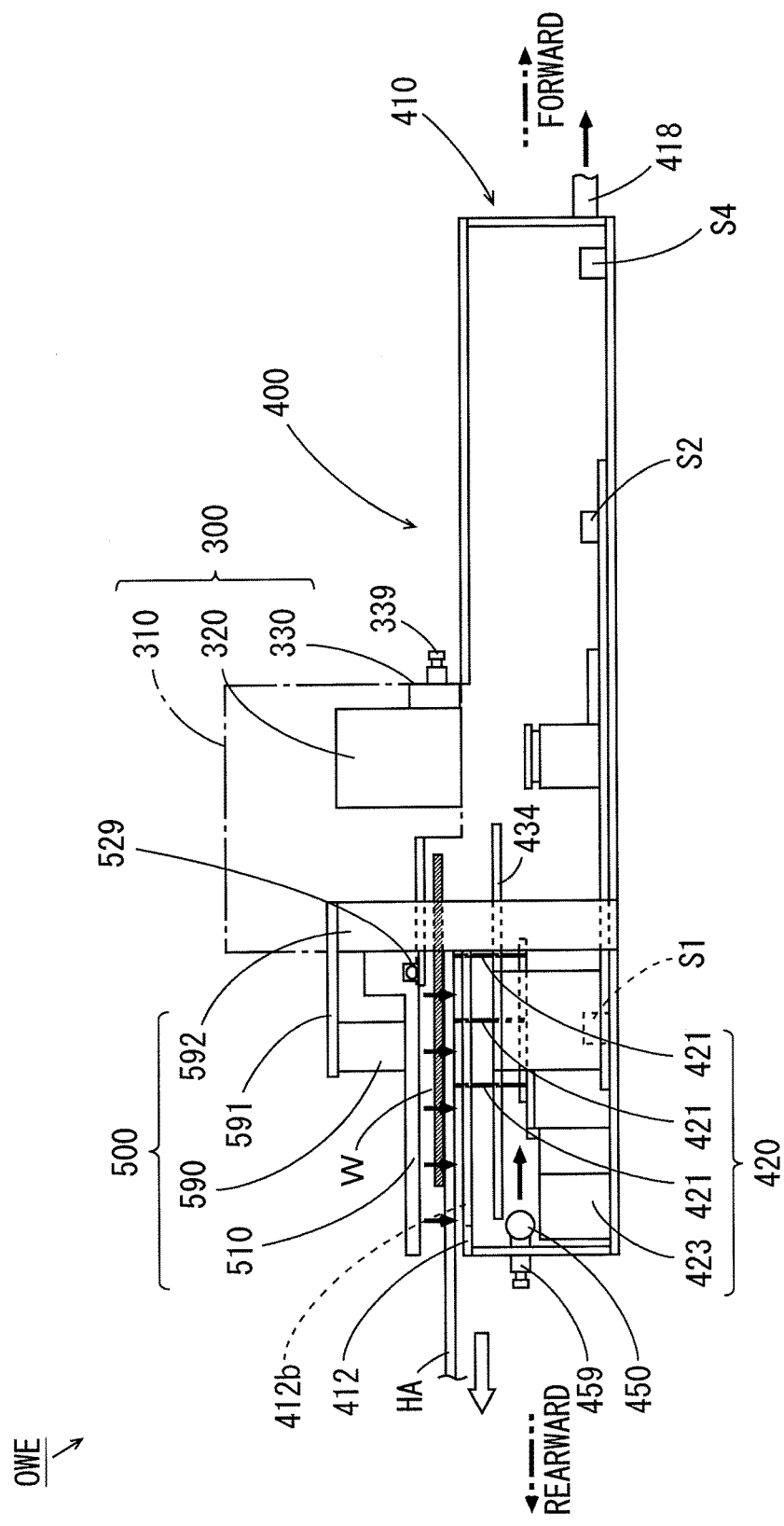
FIG. 22 is a side view for explaining the exposure processing operation for the substrate in the exposure device.

Then, the opening 412*b* is opened by lifting of the cover member 510 as shown in FIG. 22 in order to carry out the substrate W from the casing 410. At this time, an inert gas is supplied from the lower surface of the cover member 510 to the opening 412*b* by the second inert gas supplier 520 of FIG. 12 (see FIG. 13). Further, the plurality of lifting pins 421 of the receiving transferring mechanism 420 are lifted. Thus, the upper ends of the plurality of lifting pins 421 are moved from the waiting positions to the receiving transferring positions, and the substrate W is transferred from the local transport hand 434 to the plurality of lifting pins 421. In this manner, the substrate W in the horizontal attitude is moved from inside of the casing 410 to a position directly upward of the opening 412*b*.

The substrate W after the exposure processing that is placed on the plurality of lifting pins 421 is taken out in the horizontal direction by the hand HA of any of the transport mechanisms 127, 128 of FIG. 4. Thereafter, the plurality of lifting pins 421 of the receiving transferring mechanism 420 are lowered, and the cover member 510 is lowered, whereby the opening 412*b* is closed. Further, the supply of the inert gas by the second inert gas supplier 520 of FIG. 12 is stopped. Thus, the exposure device OWE returns to the initial state.

[6] Illumination Intensity Measurement Operation

In order to acquire the set speed used for the exposure processing for the substrate W, illumination intensity measurement, shown below, is performed every time the exposure processing for the predetermined number of substrates W is performed, every lot of the substrates W, or every day, for example.

Figure 23:
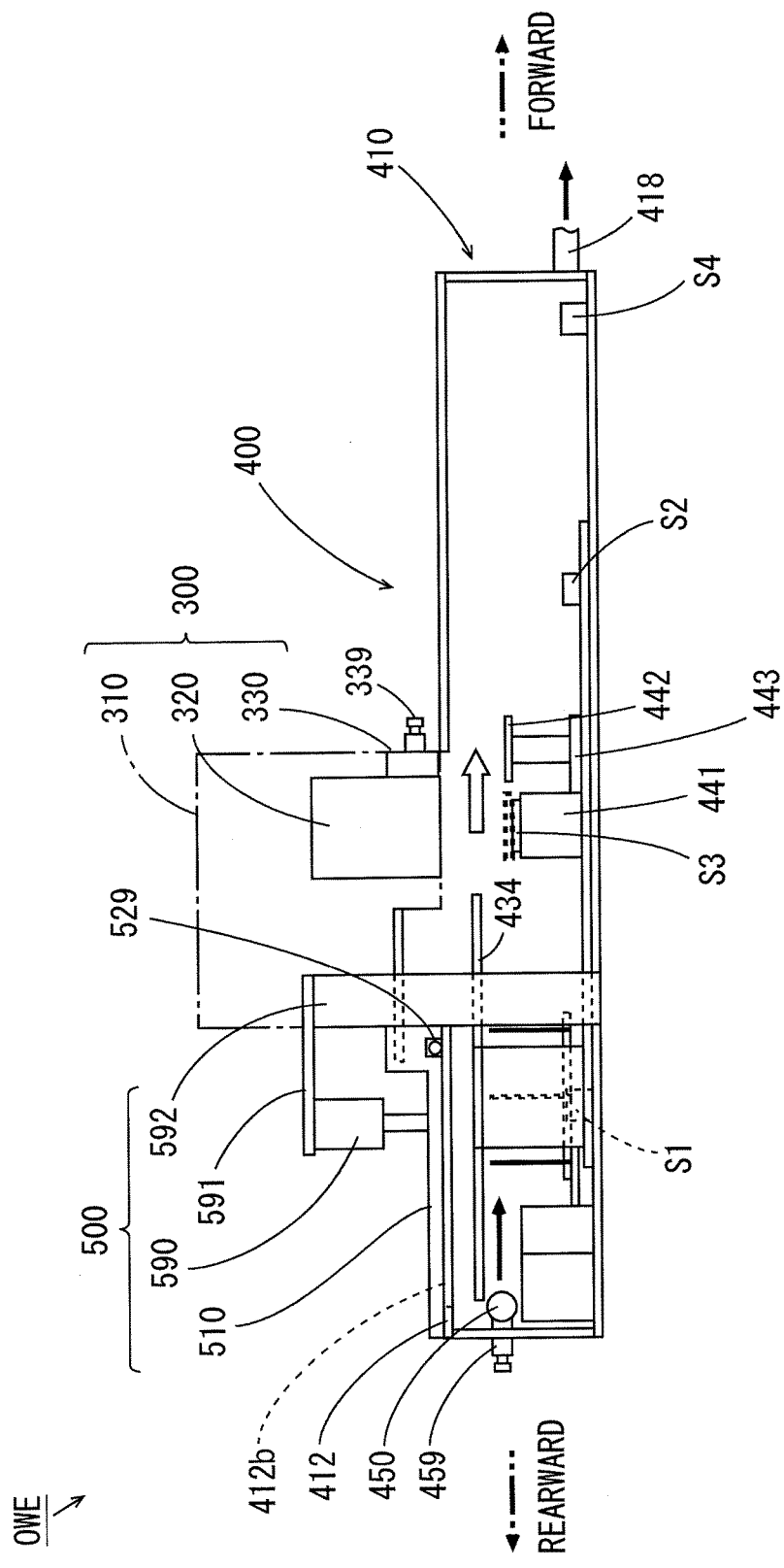
FIG. 23 is a side view for explaining an illumination intensity measurement operation in the exposure device.
Figure 24:
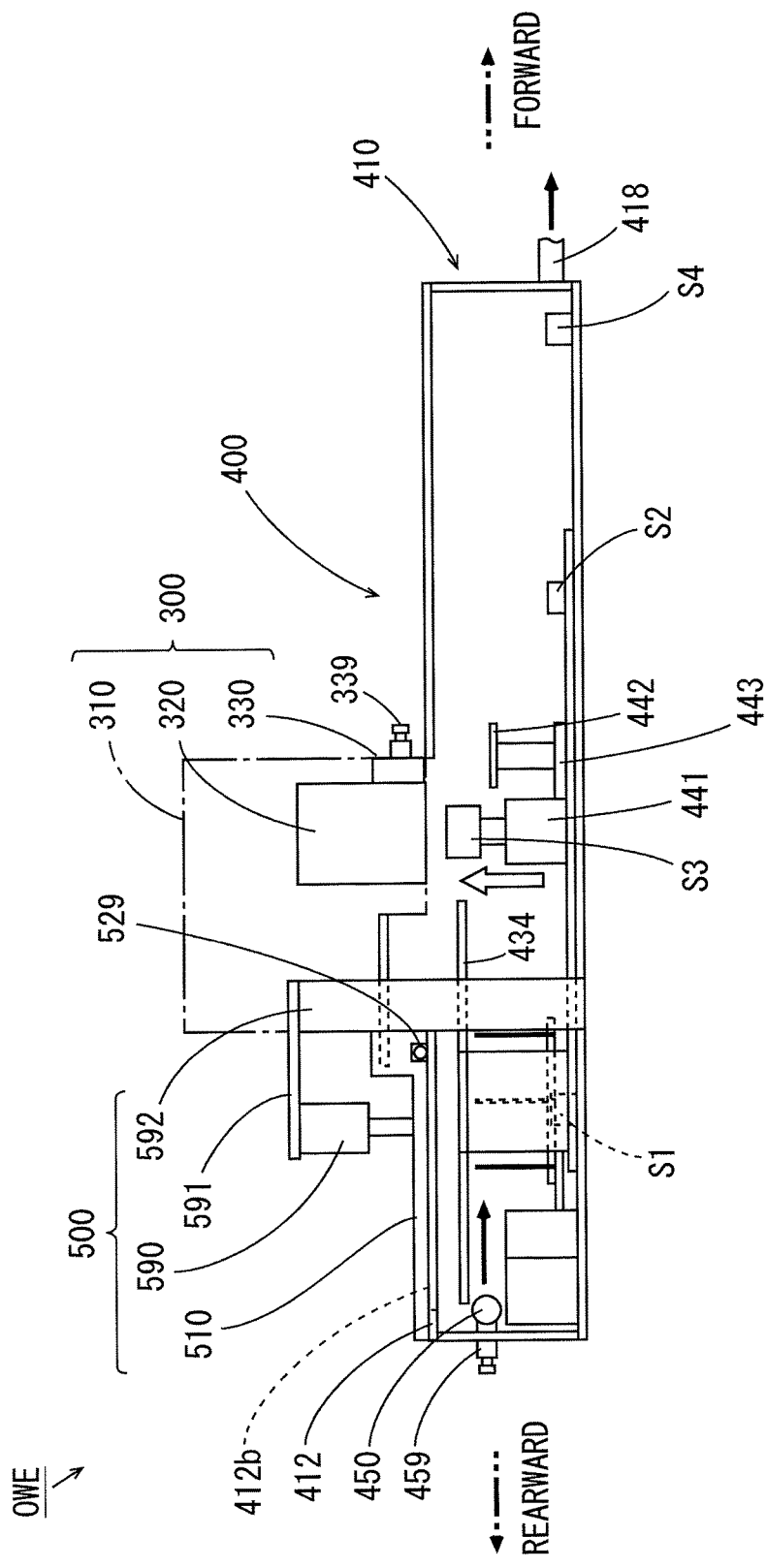
FIG. 24 is a side view for explaining the illumination intensity measurement operation in the exposure device.

FIGS. 23 to 25 are side views for explaining an illumination intensity measurement operation in the exposure device OWE. In FIGS. 23 to 25, similarly to the side view of FIG. 8, a state of the exposure device OWE from which the casing 60 (FIG. 6) and the other side surface portion 417 (FIG. 6) are removed is shown.

In the exposure device OWE, as indicated by the thick dotted line in FIG. 23, the light blocking member 442 is arranged to cover the upper end of the illumination intensity sensor S3 during a period in which the illumination intensity measurement is not performed. Thus, light is not incident on the light receiving element of the illumination intensity sensor S3 during irradiation of the substrate W with the vacuum ultraviolet rays. Therefore, deterioration of the illumination intensity sensor S3 is inhibited, and prolongation of the useful life of the illumination intensity sensor S3 is realized. Further, the illumination intensity sensor S3 is arranged downward of the moving path of the local transport hand 434.

The illumination intensity measurement is started when the opening 412*b* of the casing 410 is closed and the oxygen concentration detected by the oxygen concentration sensor S4 is lower than 1%. In the initial state, the ultraviolet ray lamp 320 is in the OFF state.

When the illumination intensity measurement is started, the light blocking member 442 is moved forward by the light blocking driver 443 as indicated by an outlined arrow in FIG. 23. Thus, the upper end of the illumination intensity sensor S3 is exposed upward.

Next, as indicated by an outlined arrow in FIG. 24, the illumination intensity sensor S3 is lifted by the sensor lifting lowering driver 441. At this time, the illumination intensity sensor S3 is positioned such that the height of the light receiving surface coincides with the height of the upper surface of the substrate W placed on the local transport hand 434.

Then, the ultraviolet ray lamp 320 is switched from the OFF state to the ON state. Thus, as indicated by a dotted pattern in FIG. 25, the strip-shape vacuum ultraviolet flux UV is emitted from the ultraviolet ray lamp 320 to the illumination intensity sensor S3.

Part of the vacuum ultraviolet flux UV emitted from the ultraviolet ray lamp 320 is incident on the light receiving element of the illumination intensity sensor S3. Thus, the illumination intensity of the vacuum ultraviolet rays with which the substrate W is irradiated during the exposure processing is detected. A result of detection of illumination intensity is supplied to the controller 114 of FIG. 1.

Thereafter, the illumination intensity sensor S3 is lowered, and the ultraviolet ray lamp 320 is switched from the ON state to the OFF state. Further, the light blocking member 442 is moved rearward to cover the upper end of the illumination intensity sensor S3. Thus, the exposure device OWE returns to the initial state.

As described above, the illumination intensity sensor S3 is positioned such that the height of the light receiving surface coincides with the height of the upper surface of the substrate W placed on the local transport hand 434 during the illumination intensity measurement. Therefore, the illumination intensity of the vacuum ultraviolet rays with which the substrate W is irradiated during the exposure for the substrate W can be accurately detected.

Further, the illumination intensity sensor S3 is arranged downward of the moving path of the local transport hand 434 during the exposure processing for the substrate W. Thus, the illumination intensity sensor S3 does not interfere with the substrate W during the exposure processing.

[7] Operations of Substrate Processing Apparatus

The operations of the substrate processing apparatus 100 will be described with reference to FIGS. 1 to 5D. In the indexer block 11, each carrier 113 in which the substrates W in the initial state (FIG. 5A) are stored is placed on each carrier platform 111 (FIG. 1). The transport mechanism 115 transports the substrate W in the initial state from the carrier 113 to each of the substrate platforms PASS1, PASS3 (FIG. 4). Further, the transport mechanism 115 transports the processed substrate W placed on each of the substrate platforms PASS2, PASS4 (FIG. 4) to the carrier 113.

In the processing block 12, the transport mechanism 127 sequentially transports the substrate W placed on the substrate platform PASS1 to the cooling unit CP (FIG. 3) of the upper thermal processing section 101 (FIG. 3) and the coating processing chamber 22 (FIG. 2). In this case, the DSA film L3 is formed on the substrate W by the coating processing unit CU after a temperature of the substrate W is adjusted to a temperature suitable for the formation of the DSA film L3 by the cooling unit CP (FIG. 5B).

Then, the transport mechanism 127 sequentially transports the substrate W on which the DSA film L3 is formed to the thermal processing unit PHP (FIG. 3), the cooling unit CP (FIG. 3) and the exposure device OWE (FIG. 3) in the upper thermal processing section 101 (FIG. 3). In this case, the heating processing for the substrate W is performed by the thermal processing unit PHP, so that the microphase separation occurs in the DSA film L3 as described above (FIG. 5C). Subsequently, the exposure processing for the substrate W is performed by the exposure device OWE after the substrate W is cooled by the cooling unit CP.

Then, the transport mechanism 127 sequentially transports the substrate W after the exposure processing by the exposure device OWE to the cooling unit CP (FIG. 3) in the upper thermal processing section 101 (FIG. 3), the development processing chamber 21 (FIG. 2) and the substrate platform PASS2 (FIG. 4). In this case, the development processing for the substrate W is performed by the development processing unit DU after the substrate W is cooled by the cooling unit CP (FIG. 5D). The substrate W after the development processing is placed on the substrate platform PASS2.

The transport mechanism 128 sequentially transports the substrate W placed on the substrate platform PASS3 to the cooling unit CP (FIG. 3) in the lower thermal processing section 102 (FIG. 3) and the coating processing chamber 24 (FIG. 2). Then, the transport mechanism 128 sequentially transports the substrate W after the processing by the coating processing unit CU to the thermal processing unit PHP (FIG. 3), the cooling unit CP (FIG. 3) and the exposure device OWE (FIG. 3) in the lower thermal processing unit 102 (FIG. 3). Then, the transport mechanism 128 sequentially transports the substrate W after the processing by the exposure device OWE to the cooling unit CP (FIG. 3) in the lower thermal processing section 102 (FIG. 3), the development processing chamber 23 (FIG. 2) and the substrate platform PASS4 (FIG. 4). The processing contents for the substrate W in the coating processing chamber 24 (FIG. 2), the lower thermal processing section 102 (FIG. 3) and the development processing chamber 23 (FIG. 2) are the same as the processing contents for the substrate W in the above-mentioned coating processing chamber 22 (FIG. 2), the upper thermal processing section 101 (FIG. 3) and the development processing chamber 21 (FIG. 2).

In this manner, in the present embodiment, the substrate W transported by the transport mechanism 127 is processed in the development processing chamber 21, the coating processing chamber 22 and the upper thermal processing section 101, and the substrate W transported by the transport mechanism 128 is processed in the development processing chamber 23, the coating processing chamber 24 and the lower thermal processing section 102. In this case, the processing for the substrates W can be concurrently performed in the upper processing section (the development processing chamber 21, the coating processing chamber 22 and the upper thermal processing section 101) and the lower processing section (the development processing chamber 23, the coating processing chamber 24 and the lower thermal processing section 102).

[8] Effects

In the above-mentioned exposure device OWE, the upper surface of the substrate W is irradiated with the vacuum ultraviolet rays emitted by the light emitter 300 while the local transport hand 434 on which the substrate W is placed is moved with respect to the light emitter 300. Thus, the entire DSA film L3 formed on the substrate W is exposed.

A moving speed of the local transport hand 434 with respect to the light emitter 300 is controlled, so that the exposure value for the DSA film L3 is adjusted. Thus, the exposure value can be adjusted over a wide range regardless of output of the vacuum ultraviolet rays emitted from the light emitter 300. As a result, even when the output of the vacuum ultraviolet rays of the light emitter 300 is changed due to deterioration over time, contamination of the emission surface or the like, the DSA film L3 formed on the one surface of the substrate W can be exposed with the predetermined set exposure value.

[9] Other Embodiments (1) In the above-mentioned embodiment, the upper surface of the substrate W is irradiated with the vacuum ultraviolet rays only in a case in which the local transport hand 434 is moved from the front position P2 to the rear position P1. However, the present invention is not limited to this. The upper surface of the substrate W may be irradiated with the vacuum ultraviolet flux only in a case in which the local transport hand 434 is moved from the rear position P1 to the front position P2 instead of the case in which the local transport hand 434 is moved from the front position P2 to the rear position P1.

Further, the upper surface of the substrate W may be irradiated with the vacuum ultraviolet rays in the case in which the local transport hand 434 is moved from the rear position P1 to the front position P2 and the case in which the local transport hand 434 is moved from the front position P2 to the rear position P1.

(2) While the exposure device OWE is used for the exposure processing for reforming the DSA film L3 in the above-mentioned embodiment, the present invention is not limited to this. For example, the resist film after the development processing is irradiated with ultraviolet rays and the resist film is reformed, whereby the above-mentioned guide pattern L2 is formed. Therefore, the exposure device OWE can be used to reform the resist film formed on the substrate W in addition to the DSA film L3.

(3) While the vacuum ultraviolet rays are used as light for reforming the DSA film L3 in the above-mentioned embodiment, the present invention is not limited to this. The DSA film L3 may be reformed using the ultraviolet rays having a wavelength longer than about 230 nm. Further, as described above, when a film other than the DSA film L3 that is formed on the substrate W is reformed, light having a wavelength longer than the ultraviolet rays may be used as light capable of reforming the film.

(4) While an inert gas is not supplied from the third inert gas supplier 330 to the inside of the casing 410 during the illumination intensity measurement in the above-mentioned embodiment, the present invention is not limited to this. The inert gas may be supplied from the third inert gas supplier 330 to the casing 410 during the illumination intensity measurement. Further, in this case, an air guide member that guides the inert gas injected from the plurality of injection holes 331 to the upper end of the illumination intensity sensor S3 may be arranged at a position opposite to the plurality of injection holes 331 of the third inert gas supplier 330. Thus, the illumination intensity of the vacuum ultraviolet rays with which the one surface of the substrate W is irradiated during the exposure processing can be more accurately detected.

(5) While only one illumination intensity sensor S3 is used in order to detect the illumination intensity of the vacuum ultraviolet rays with which the substrate W is irradiated from the light emitter 300 during the exposure processing in the above-mentioned embodiment, the present invention is not limited to this. The plurality of illumination sensors S3 may be used to detect the illumination intensity of the vacuum ultraviolet rays. In this case, the moving speed of the substrate W during the exposure processing can be more appropriately calculated based on an average value of the illumination intensity detected by the plurality of illumination intensity sensors S3, for example.

(6) In the above-mentioned embodiment, the substrate W is placed on the local transport hand 434 during the exposure processing. In the present invention, a holding mechanism for stably holding the substrate W may be provided at the upper surface of the local transport hand 434. For example, the plurality of holding pins that abut against the outer peripheral end of the substrate W and capable of positioning the substrate W may be provided on the local transport hand 434. Alternatively, a suction holder that sucks the lower surface of the substrate W may be provided on the local transport hand 434. In this case, during the movement of the substrate W in the casing 410, the substrate W is prevented from falling from the local transport hand 434.

(7) While the feed shaft 431 and the feed shaft motor 432 are used as a mechanism for moving the substrate W in the front-and-rear direction during the exposure processing in the above-mentioned embodiment, the present invention is not limited to this. If the local transport hand 434 can be moved in the front-and-rear direction in the casing 410, a belt driving mechanism or a linear motor driving mechanism may be provided instead of the feed shaft 431 and the feed shaft motor 432.

(8) While a nitrogen gas is used as the inert gas in order to reduce the oxygen concentration in the casing 410 in the above-mentioned embodiment, the present invention is not limited to this. As the inert gas supplied to the casing 410, an argon gas, a helium gas or the like may be used instead of the nitrogen gas.

(9) While the second inert gas supplier 520 is provided at the cover member 510 in the above-mentioned embodiment, the second inert gas supplier 520 does not have to be provided. In this case, the number of components of the exposure device OWE is reduced.

(10) While the third inert gas supplier 330 is provided at the light emitter 300 in the above-mentioned embodiment, the third inert gas supplier 330 does not have to be provided. In this case, the number of components of the exposure device OWE is reduced.

(11) In the above-mentioned embodiment, the local transport hand 434 is moved in the horizontal direction with the strip-shape vacuum ultraviolet flux being emitted by the ultraviolet ray lamp 320, so that the strip-shape vacuum ultraviolet flux is scanned from one end to the other end of the substrate W. However, the present invention is not limited to this. With the substrate W being placed on a fixed platform stage, the ultraviolet ray lamp 320 may be moved in the horizontal direction over the substrate W, so that the strip-shape vacuum ultraviolet flux is scanned from the one end to the other end of the substrate W. In this case, the moving speed of the ultraviolet ray lamp 320 is adjusted, so that effect similar to the above-mentioned example can be acquired.

[10] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the exposure device OWE is an example of an exposure device, the local transport hand 434 is an example of a holder, the vacuum ultraviolet rays are examples of light for reforming a film, the light emitter 300 is an example of an emitter, the feed shaft 431, the feed shaft motor 432, the two guide rails 433, the two hand support members 435 and the coupling member 439 are examples of a relative mover, and the controller 114 is an example of a controller.

Further, the illumination intensity sensor S3 is an example of an illumination intensity detector, the light receiving element of the illumination intensity sensor S3 is an example of a light receiving element, the sensor lifting lowering driver 441 is an example of a light receiving element moving mechanism, the light blocking member 442 and the light blocking driver 443 are examples of a light blocking mechanism, the casing 410 is an example of a casing, the first inert gas supplier 450 is an example of an inert gas supplier, and the oxygen concentration sensor S4 is an example of a concentration detector.

Further, the coating processing unit CU is an example of a coating processor, the thermal processing unit PHP and the cooling unit CP are examples of a thermal processor, the development processing unit DU is an example of a development processor, and the substrate processing apparatus 100 is an example of a substrate processing apparatus.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing various types of substrates.

We claim:

1. An exposure device that exposes a substrate, comprising:
   a holder that holds the substrate having one surface on which a film having a predetermined pattern is formed;
   an emitter that emits light for reforming the film;
   a relative mover that moves at least one of the holder and the emitter in one direction relative to another one such that the one surface of the substrate held by the holder is irradiated with light emitted by the emitter;
   an illumination intensity detector that detects illumination intensity of light with which the substrate is irradiated by the emitter; and
   a controller that calculates a moving speed for acquiring a predetermined exposure value based on the illumination intensity detected by the illumination intensity detector such that an exposure value for the film is the predetermined exposure value, and controls the relative mover such that the holder and the emitter are relatively moved at the calculated moving speed,
   wherein the illumination intensity detector includes
   a light receiving element that receives light emitted by the emitter, and
   a light blocking mechanism configured to be switchable between a first state in which light emitted by the emitter is incident on the light receiving element and a second state in which light emitted by the emitter is not incident on the light receiving element, and
   the controller switches the light blocking mechanism to the first state during detection of the illumination intensity, and switches the light blocking mechanism to the second state during the irradiation of the substrate with light by the emitter.

2. The exposure device according to claim 1, wherein
   the relative mover moves the holder in one direction relative to the emitter during irradiation of the substrate with light by the emitter,
   the illumination intensity detector further includes
   a light receiving element moving mechanism that moves the light receiving element, and
   the light receiving element moving mechanism moves the light receiving element to a position that does not interfere with the substrate during the irradiation of the substrate with light by the emitter, and moves the light receiving element onto a moving path of the substrate by the relative mover during detection of illumination intensity except for a period in which the substrate is being irradiated with light.

3. The exposure device according to claim 1, wherein
   light from the emitter with which the substrate is irradiated includes vacuum ultraviolet rays.

4. A substrate processing apparatus, comprising:
   the exposure device according to claim 1;
   a coating processor that forms the film on the one surface of the substrate by applying a processing liquid including a directed self assembly material to the one surface of the substrate before irradiation with light by the exposure device;
   a thermal processor that performs thermal processing on the substrate after formation of the film by the coating processor and before irradiation with light by the exposure device; and
   a development processor that performs development processing for the film by supplying a solvent to the one surface of the substrate after irradiation with light by the exposure device.

5. An exposure device comprising:
   a holder that holds the substrate having one surface on which a film having a predetermined pattern is formed;
   an emitter that emits light for reforming the film;
   a relative mover that moves at least one of the holder and the emitter in one direction relative to another one such that the one surface of the substrate held by the holder is irradiated with light emitted by the emitter;
   a controller that controls relative moving speed of the holder and the emitter by the relative mover such that an exposure value for the film is a predetermined exposure value;
   a casing that stores the substrate held by the holder;
   an inert gas supplier that supplies an inert gas to an inside of the casing; and
   a concentration detector that detects an oxygen concentration in the casing,
   wherein the light from the emitter with which the substrate is irradiated is vacuum ultraviolet rays, and
   the controller controls the emitter and the relative mover such that, when the oxygen concentration detected by the concentration detector is not more than a predetermined processing concentration such that ozone generated by oxygen that remains in a path of the vacuum ultraviolet rays is reduced, the substrate is irradiated with the vacuum ultraviolet rays emitted by the emitter.

6. A substrate processing apparatus comprising:
the exposure device according to claim 5;
a coating processor that forms the film on the one surface of the substrate by applying a processing liquid including a directed self assembly material to the one surface of the substrate before irradiation with light by the exposure device;
a thermal processor that performs thermal processing on the substrate after formation of the film by the coating processor and before irradiation with light by the exposure device; and
a development processor that performs development processing for the film by supplying a solvent to the one surface of the substrate after irradiation with light by the exposure device.

7. An exposure method for exposing a substrate including the steps of:
holding the substrate having one surface on which a film having a predetermined pattern is formed by a holder;
emitting light for reforming the film by an emitter;
moving at least one of the holder and the emitter in one direction relative to another one such that the one surface of the substrate held by the holder is irradiated with light emitted by the emitter;
detecting illumination intensity of light with which the substrate is irradiated by the emitter using a light receiving element that receives the light emitted by the emitter;
calculating a moving speed for acquiring a predetermined exposure value based on the detected illumination intensity such that an exposure value for the film is the predetermined exposure value, and controlling relative moving speed of the holder and the emitter such that the holder and the emitter are relatively moved at the calculated moving speed; and
controlling a light blocking mechanism configured to be switchable between a first state in which light emitted from the emitter is incident on the light receiving element and a second state in which light emitted by the emitter is not incident on the light receiving element,
wherein the step of controlling the light blocking mechanism includes switching the light blocking mechanism to the first state during detection of the illumination intensity and switching the light blocking mechanism to the second state during irradiation of the substrate with light by the emitter.

8. The exposure method according to claim 7, wherein
the step of relatively moving is moving the holder in one direction relative to the emitter, and
the step of detecting the illumination intensity includes
moving the light receiving element to a position that does not interfere with the substrate during irradiation of the substrate with light by the emitter, and
moving the light receiving element onto a moving path of the substrate moved by the holder during detection of illumination intensity except for a period in which the substrate is being irradiated with light.

9. A substrate processing method including:
the exposure method according to claim 7;
the step of forming the film on the one surface of the substrate by applying a processing liquid including a directed self assembly material to the one surface of the substrate before irradiation with light by the exposure method;
the step of performing thermal processing on the substrate after formation of the film and before the irradiation with light by the exposure method; and
the step of performing development processing for the film by supplying a solvent to the one surface of the substrate after the irradiation with light by the exposure method.

10. An exposure method for exposing a substrate including the steps of:
holding the substrate having one surface on which a film having a predetermined pattern is formed by a holder;
storing the substrate held by the holder in a casing;
detecting an oxygen concentration in the casing;
emitting light for reforming the film by an emitter;
moving at least one of the holder and the emitter in one direction relative to another one such that the one surface of the substrate held by the holder is irradiated with light emitted by the emitter; and
controlling relative moving speed of the holder and the emitter such that an exposure value for the film is a predetermined exposure value,
wherein the light from the emitter with which the substrate is irradiated is vacuum ultraviolet rays, and
the step of emitting includes the step of performing irradiation of the substrate with the vacuum ultraviolet rays by the emitter when the oxygen concentration detected by the step of detecting is not more than a predetermined processing concentration such that ozone generated by oxygen that remains in a path of the vacuum ultraviolet rays is reduced.

11. A substrate processing method including:
the exposure method according to claim 10;
the step of forming the film on the one surface of the substrate by applying a processing liquid including a directed self assembly material to the one surface of the substrate before irradiation with light by the exposure method;
the step of performing thermal processing on the substrate after formation of the film and before the irradiation with light by the exposure method; and
the step of performing development processing for the film by supplying a solvent to the one surface of the substrate after the irradiation with light by the exposure method.

* * * * *